United States Patent [19]

Okudaira et al.

[11] Patent Number: 5,459,345
[45] Date of Patent: Oct. 17, 1995

[54] SEMICONDUCTOR DEVICE HIGH DIELECTRIC CAPACITOR WITH NARROW CONTACT HOLE

[75] Inventors: Tomonori Okudaira; Keiichiro Kashihara, both of Hyogo, Japan

[73] Assignee: Mitsubishi Denki Kabushiki Kaisha, Tokyo, Japan

[21] Appl. No.: 264,092

[22] Filed: Jun. 22, 1994

[30] Foreign Application Priority Data

Jun. 28, 1993 [JP] Japan ................... 5-157591

[51] Int. Cl.⁶ ........................... H01L 27/00
[52] U.S. Cl. ................. 257/310; 257/295; 257/752; 257/774
[58] Field of Search .................... 257/310, 306, 257/900, 752, 295, 774, 296, 308

[56] References Cited

U.S. PATENT DOCUMENTS 5,272,367  12/1993  Dennison et al. ................. 257/900
5,335,138   8/1994  Sandhu et al. .................... 257/310

FOREIGN PATENT DOCUMENTS 3-231431  10/1991  Japan.

*Primary Examiner*—Robert P. Limanek
*Attorney, Agent, or Firm*—Lowe, Price, LeBlanc & Becker

[57] ABSTRACT

An object of the invention is to provide a semiconductor device which has a capacitor having good anti-leak characteristics and good breakdown voltage characteristics and is suitable to high integration. Source/drain regions (25) are formed at a surface of a silicon substrate (31). Interlayer insulating films (1) and (3) having contact holes (1a) and (3a), through which a surfaces of the source/drain region is partially exposed, is formed on the surface of silicon substrate (31). Contact holes (1a) and (3a) are filled with plug layer (9a). A capacitor (20) having a highly dielectric film (15) is formed such that it is electrically connected to source/drain region (25) through plug layer (9a). The interlayer insulating film is formed of a two-layer structure including a silicon oxide film (1) and a silicon nitride film (3). Silicon nitride film (3) and plug layer (9a) have the top surfaces flush with each other.

7 Claims, 25 Drawing Sheets

SEMICONDUCTOR DEVICE HIGH DIELECTRIC CAPACITOR WITH NARROW CONTACT HOLE

BACKGROUND OF THE INVENTION

1. Field of the Invention

The present invention relates to a semiconductor device and a method of manufacturing the same, and in particular, to a semiconductor device in which a dielectric film located between electrodes of a capacitor is made of high permittivity dielectric material as well as a method of manufacturing the same.

2. Description of the Related Art

In recent years, demands for semiconductor memory devices have been rapidly increased owing to remarkable spread of information equipments such as computers. In connection with function, such devices have been demanded that have a large scale storage capacity and can operate at a high speed. In compliance with these demands, technologies have been developed for improving degree of integration, responsiveness and reliability of the semiconductor memory devices.

DRAMs (Dynamic Random Access Memories) have been known as a kind of semiconductor memory devices which can perform random input and output of storage information. The DRAM is formed of a memory cell array, which is a storage region storing a large number of memory information, and a peripheral circuitry required for external input and output.

A structure of the DRAM will be described below.

FIG. 18 is a block diagram showing a structure of a conventional DRAM. Referring to FIG. 18, a DRAM 350 includes a memory cell array 351, a row and column address buffer 352, a row decoder 353, a column decoder 354, a sense refresh amplifier 355, a data-in buffer 356, a data-out buffer 357 and a clock generator 358.

Memory cell array 351 serves to store data signals of memory information. Row and column address buffer 352 serves to receive an externally applied address buffer signal used for selecting a memory cell which forms a unit memory circuit. Row decoder 353 and column decoder 354 decode the address buffer signal to designate the memory cell. Sense refresh amplifier 355 serves to amplify and read the signal stored in the designated memory cell. Data-in buffer 356 and data-out buffer 357 serve to input and output the data, respectively. Clock generator 358 serves to generate a clock signal.

In the semiconductor chip of the DRAM thus structured, memory cell array 351 occupies a large area. Memory cell array 351 is formed of a plurality of memory cells which are disposed in a matrix form and each is operable to store the unit memory information. Thus, in general, the memory cell is formed of one MOS (Metal Oxide Semiconductor) transistor and one capacitor connected thereto. This memory cell is well known as a memory cell of one-transistor and one-capacitor type. The memory cell thus constructed has a simple structure, so that the degree of integration of the memory cell array can be improved readily and thus the memory cells have been widely used in the DRAM of a large capacity.

The memory cell of the DRAM can be classified into several types according to the structure of the capacitor. In a stacked type capacitor among them, an opposition area of electrodes of the capacitor can be increased readily. Therefore, a sufficient capacitor capacitance can be readily ensured even if elements of the semiconductor device are miniaturized to a high extent for improving the degree of integration. By this reason, the stacked type capacitors have been widely used in accordance with high integration of the semiconductor device.

FIG. 19 shows a sectional structure of a DRAM provided with a stacked type capacitor in the prior art. Referring to FIG. 19, a silicon substrate 331 is provided at its surface with an isolating oxide film 333 for electrically isolating elements from each other. A channel stopper region 335 is formed at a region under isolating oxide film 333. Isolating oxide film 333 and channel stopper region 335 electrically isolate a portion of the surface of silicon substrate 331, at which a memory cell of the DRAM is formed. Memory cell includes one transfer gate transistor 330 and one capacitor 320.

Transfer gate transistor 330 includes a gate oxide film 321, a gate electrode 323 and a pair of source/drain regions 325. Source/drain regions 325 are formed at the surface of silicon substrate 331 with a predetermined space between each other. Source/drain regions 325 have an LDD (Lightly Doped Drain) structure. Thus, each of source/drain regions 325 is formed of a two-layer structure including a relatively lightly doped impurity region 325a and a relatively heavily doped impurity region 325b. Gate electrode 323 is formed on a region located between source/drain regions 325 with gate oxide film 321 therebetween. The surface of gate electrode 323 is covered with an insulating film 327.

There is formed an insulating film 329 which covers transfer gate transistor 330 and partially exposes the surfaces of source/drain regions 325. Capacitor 320 is in contact with one of source/drain regions 325 not covered by insulating film 329.

Capacitor 320 has a lower electrode layer 313, a capacitor insulating layer 315 and an upper electrode layer 317. Lower electrode layer (storage node) 313 is in contact with the surface of one of source/drain regions 325 and extends over insulating film 329. Capacitor insulating layer 315 mainly made of silicon oxide covers the surface of lower electrode layer 313. Upper electrode layer (cell plate) 317 covers lower electrode layer 313 with capacitor insulating layer 315 therebetween. Electric charges are accumulated in an opposition region through which lower electrode layer 313 and upper electrode layer 317 at both sides of capacitor insulating layer 315 oppose to each other.

An interlayer insulating film 301 covering capacitor 320 is formed over the whole surface of silicon substrate 331. Interlayer insulating film 301 is provided with a contact hole 301a. Contact hole 301a reaches the surface of the other of source/drain regions 325. A bit line 337 is formed on interlayer insulating film 301 and is in contact with source/drain region 325 through contact hole 301a.

Bit line 337 includes a polycrystalline silicon layer 337a and a tungsten silicide layer 337b. More specifically, polycrystalline silicon layer 337a and tungsten silicide layer 337b are successively deposited to form bit line 337. Bit line 337 is covered with an insulating film 319.

The memory cell having the stacked type capacitor shown in FIG. 19 is suitable to high integration owing to the structural features described above.

If the DRAM is integrated to a higher degree, further reduction of the memory cell size is inevitably required. In accordance with reduction of the memory cell size, a planar area occupied by the capacitor is also reduced. If the occupied planar area is reduced as described above, an area of surface region of lower electrode layer 313 decreases substantially in proportion to the above planar reduction, and accordingly, the opposition area of electrodes of capacitor 320 also decreases. Thus, the quantity of charges accumulated in the capacitor (i.e., the quantity of charges accumulated in the memory cell of one bit) decreases. If the quantity of charges accumulated in the memory cell of one bit decreases below a predetermined value, operation of the DRAM as the storage region becomes unstable, resulting in lower reliability.

In order to prevent the instability in operation of DRAM, it is necessary to increase the capacitance of capacitor while maintaining the occupied planar area within a limited value. In order to increase the capacitor capacitance, such measures as (1) reduction of a thickness of the capacitor insulating layer and (2) increase of the dielectric constant of the capacitor insulating layer have been studied.

In connection with the reduction of the thickness of the capacitor insulating layer at the aforementioned item (1), the thickness has been generally reduced to a limit as long as a silicon oxide film is used as the capacitor insulating layer. Therefore, it is necessary to provide a capacitor of a complicated form such as a cylindrical form or a fin-like form in order to increase the capacitor capacitance using the capacitor insulating layer made of a silicon oxide film. However, the capacitor having such a complicated form requires an extremely complicated manufacturing process.

Accordingly, technologies are now being developed extensively in connection with increase of the capacitor dielectric constant at the above item (2). Increase of the dielectric constant of the capacitor insulating layer can be achieved by employing the capacitor insulating layer made of material having a high dielectric constant, i.e., so-called high permittivity dielectric material. This high permittivity dielectric material generally has a dielectric constant several times to several hundred times as large as that of a silicon oxide film. Therefore, by using the capacitor insulating layer made of the high permittivity dielectric material, the capacitance can be readily increased while maintaining a simple form of the capacitor.

Material referred to as the high permittivity dielectric material includes tantalum oxide ($Ta_2O_5$), lead titanate zirconate (PZT), lanthan-lead titanate zirconate (PLZT), strontium titanate (STO), barium titanate (BTO).

Description will be made on a memory cell structure of the DRAM having the capacitor employing the capacitor insulating layer made of high permittivity dielectric material, with reference to the drawings showing a conventional semiconductor device.

FIG. 20 is a cross section schematically showing a structure of the conventional semiconductor device. Referring to FIG. 20, a plurality of memory cells of a DRAM are formed at a region in a silicon substrate 31 isolated by isolating oxide films 33 and channel stopper regions 35. Each memory cell is a memory cell of one-transistor and one-capacitor type having a transfer gate transistor 30 and a capacitor 420.

Each transfer gate transistor 30 has a gate oxide film 21, a gate electrode 23 and a pair of source/drain regions 25. Source/drain regions 25 are formed at the surface of silicon substrate 31 with a predetermined space between each other. Source/drain regions 25 have an LDD (Lightly Doped Drain) structure. Thus, each of source/drain regions 25 is formed of a two-layer structure including a relatively lightly doped impurity region 25a and a relatively heavily doped impurity region 25b. Gate electrode 23 is formed on a region located between paired source/drain regions 25 with gate oxide film 21 therebetween. The surface of gate electrode 23 is covered with an insulating film 27.

A bit line 37 extends on insulating film 27 and is in contact with one of the source/drain regions 25 forming the transfer gate transistor 30. Bit line 37 and transfer gate transistor 30 are covered with an interlayer insulating film 401 which is made of a silicon oxide film and is formed on the whole surface of silicon substrate 31. Bit line 37 thus covered with interlayer insulating film 401 is in the form of a buried bit line.

Interlayer insulating film 401 is provided with contact holes 401a. Each contact hole 401a reaches a surface of the other of source/drain regions 25. Each contact hole 401a is filled with a plug layer 409a. Plug layer 409a is made of polycrystalline silicon doped with impurity (which will also be referred to as "doped polycrystalline silicon").

The top surface of plug layer 409a is recessed or receded by a distance r from the top surface of interlayer insulating film 401. Thus, the top surface of plug layer 409a forms a recess of a size r with respect to the top surface of interlayer insulating film 401. Capacitor 420 is formed such that it electrically connects with source/drain region 25 through plug layer 409a.

Capacitor 420 has a lower electrode layer 413, a capacitor insulating layer 415 and an upper electrode layer 417. Capacitor insulating layer 415 of capacitor 420 is made of the high permittivity dielectric material such as PZT, as already described. The PZT and PLZT exhibit the largest dielectric constant when layers of them are formed on platinum (Pt). Therefore, lower electrode layer 413 is made of platinum in many cases.

Lower electrode layer 413 is electrically connected to plug layer 409a via barrier layer 411, e.g., made of titanium (Ti) and extends on the surface of interlayer insulating film 401. Barrier layer 411 prevents diffusion of impurity contained in plug layer 409a into lower electrode layer 413, and also serves to improve adhesion between lower electrode layer 413 and interlayer insulating film. Capacitor insulating layer 415 made of high permittivity dielectric material covers the surface of lower electrode layer 413. Upper electrode layer 417 covers lower electrode layer 413 with capacitor insulating layer 415 therebetween.

Upper electrode layer 417 may be made of platinum or doped polycrystalline silicon. Capacitor 420 is covered with an insulating film 419.

Now, a method of manufacturing the conventional semiconductor device will be described below.

FIGS. 21 to 30 are schematic cross sections showing a process of manufacturing the conventional semiconductor device in accordance with the order of steps. Referring first to FIG. 21, isolating oxide film 33 is formed at the surface of silicon substrate 31, for example, by an LOCOS (Local Oxidation of Silicon) method. At this step, channel stopper region 35 is formed at a region under the isolating oxide film 33.

Gate electrode 23 is formed on the surface of silicon substrate 31 with gate oxide film 21 therebetween. Using gate electrode 23 and others as a mask, ion implantation is carried out to form relatively lightly doped impurity regions 25. Insulating film 27 is formed to cover gate electrode 23. Using insulating film 27 and others as a mask, ion implantation is carried out to form relatively heavily doped impurity regions 25b. Lightly and heavily doped impurity regions 25a and 25b form source/drain regions 25. In this manner, transfer gate transistor 30 is formed.

Buried bit line 37 is formed such that it extends on insulating film 27 and is in contact with one of source/drain regions 25. A silicon oxide film 401b is formed on the whole surface of silicon substrate 31 by, for example, a CVD (Chemical Vapor Deposition) method so that it covers buried bit line 37 and transfer gate transistor 30. A resist film 401c for forming a flat surface is formed on the surface of silicon oxide film 401b. Resist film 401c may be formed by applying an SOG (Spin On Glass) film. Then, resist film 401c and silicon oxide film 401b are etched back up to a position indicated by dotted line.

Referring to FIG. 22, by this etchback, silicon oxide film 401 having a substantially flat surface is completed.

Referring to FIG. 23, photoresist is applied to the whole surface of silicon oxide film 401, and is patterned into an intended configuration by, for example, exposure. By this patterning, resist pattern 441 having hole patterns 441a located above source/drain regions 25 is completed.

Referring to FIG. 24, anisotropic etching is effected on silicon oxide film 401, using this resist pattern 441 as a mask. By the etching contact holes 401a are formed, which partially expose the surfaces of source/drain regions 25, in silicon oxide film 401. Thereafter, resist pattern 441 is removed.

Referring to FIG. 25, doped polycrystalline silicon film 409 having a film thickness from 5000 to 8000 Å and filling contact hole 401 is formed by the CVD method on the whole surface of silicon oxide film 401. Etchback is effected on doped polycrystalline silicon film 409 to expose at least the surface of silicon oxide film 401.

Referring to FIG. 26, the aforementioned etchback is carried out such that about 20% to 30% of the film thickness of doped polycrystalline silicon film 409 is over-etched for completely removing etching residue on stepped portions (not shown) of the surface of silicon oxide film 401. Owing to the over-etching and the accompanied loading effect, doped polycrystalline silicon film 409a is recessed by a considerable amount (size r) from the surface of silicon oxide film 401.

Silicon oxide film 401 is hardly removed by the above etch-back because it has an etching selectivity higher than that of doped polycrystalline silicon film 409.

Referring to FIG. 27, barrier layer 411, e.g., of titanium and platinum layer 413 are successively deposited by the sputtering method on the surface including the surfaces of plug layers 409a recessed by the size r.

Referring to FIG. 28, resist pattern 443 patterned into intended configuration is formed on a part of the surface of platinum layer 413. Using resist pattern 443 as a mask, platinum layer 413 and barrier layer 411 are successively etched and removed. Thereby, lower electrode layer 413 made of platinum is completed. Thereafter, resist pattern 443 is removed.

Referring to FIG. 29, sputtering is performed to form capacitor insulating layer 415 made of high permittivity dielectric material such as PZT to cover the surfaces of lower electrode layers 413.

Referring to FIG. 30, sputtering is performed to form upper electrode layer 417, made of e.g., platinum to cover the surface of lower electrode layer 413 with capacitor insulating layer 415 therebetween. Thereby, capacitor 420 including lower electrode layer 413, capacitor insulating layer 415 and upper electrode layer 417, is completed. Insulating film 419 covering capacitor 420 is formed by the CVD method.

The conventional semiconductor device using the capacitor insulating layer made of high permittivity dielectric material is structured and manufactured as described above. Further, the capacitor capacitance can be readily increased while maintaining a simple shape of the capacitor as described above, so that such a capacitor is a promising candidate for highly integrated storage element such as 256M DRAM.

However, the conventional semiconductor device and the method of manufacturing the same suffer from following three problems.

First problem is that the anti-leak characteristics and breakdown voltage characteristics between lower electrode layer 413 and upper electrode layer 417 forming capacitor 420 are degraded.

In the process of etching back doped polycrystalline silicon film 409 shown in FIGS. 25 and 26, over-etching is effected on the doped polycrystalline silicon film 409 for completely removing the etching residue at the top surface of silicon oxide film 401. Doped polycrystalline silicon film 409 may be etched by the RIE of the parallel plate type under the etching conditions suitable to mass production (e.g., with gas system of $SF_6$, flow rate of $SF_6$ of 100 sccm, gas pressure of 500 mTorr, RF power of 200 W, time from 1 to 2 minutes and input power of 0.25 $W/cm^2$). In this case, the etching selectivity of doped polycrystalline silicon film 409 with respect to silicon oxide film 401 is from 10 to 20. Thus, doped polycrystalline silicon film 409 can be etched very easily, while silicon oxide film 401 is hardly etched.

When doped polycrystalline silicon film 409 is etched to a certain extent so that the top surface of silicon oxide film 401 is exposed, the exposed portions of the doped polycrystalline silicon 409 remains only in the contact holes 401a. When the exposed area of the film to be etched, i.e., doped polycrystalline silicon film 409 remarkably decreases as described above, the etching rate of the film to be etched increases due to a so-called loading effect.

Due to the synergetic effect of the over-etching of doped polycrystalline silicon film 409 and the loading effect, each plug layer 409a has the top surface which is recessed by a certain size into contact hole 401a. Thus, the recess is formed in contact hole 401a. Platinum layer 413 and capacitor insulating layer 415 made of high permittivity dielectric material are formed on the structure including the recesses by the method such as the sputtering method of which step coverage is poor as shown in FIGS. 27 and 29, so that capacitor insulating layer 415 has thin portions located on stepped portions of platinum layer 413.

FIG. 31 is an enlarged fragmentary cross section showing the recess (portion P) shown in FIG. 20. Referring to FIG. 31, capacitor insulating layer 415 has a thin portion or, in the worst case, discontinuous portion at the lower end (portion R) of the recess. If the film thickness of capacitor insulating layer 415 is reduced, a leak current between lower electrode layer 413 and upper electrode layer 417 increases, so that it is difficult to obtain a predetermined breakdown voltage. Thus, good breakdown voltage characteristics and good anti-leak characteristics cannot be obtained between lower electrode layer 413 and upper electrode layer 417. If capacitor insulating layer 415 is disconnected, upper electrode layer 417 and lower electrode layer 413 are directly connected together, so that the structure cannot function as a capacitor.

The second problem is that the structure of the conventional semiconductor device can hardly improve the degree of integration.

In general, if the DRAM is integrated to a higher degree, a memory cell size is inevitably reduced. This reduction of memory cell size reduces a pitch between word lines. More specifically, as shown in FIG. 20, distance $L_0$ of 0.6 μm between word lines (gate electrodes) 23 has been studied. A minimum allowable open diameter $L_F$ of contact hole 401a is limited to 0.4 μm by the photolithography. Under these conditions, distance $L_G$ between contact hole 401a and word line 23 is 0.1 μm. Thus, 0.1 μm, which is the distance $L_G$ between word line 23 and contact hole 401a, is a value of overlap margin of the mask for forming contact hole 401a.

However, the mask overlapping accuracy at the mass production level in the photolithography is about 0.18 μm. Therefore, the overlap margin under the above conditions may cause plug layer 409a to be in contact with word line 23.

FIGS. 32 to 34 are schematic cross sections showing the process, in accordance with the order of steps, by which the plug layer and the word lines are formed to be in contact with each other. Referring first to FIG. 32, in order to form the contact hole reaching source/drain region 25 in silicon oxide film 401, resist pattern 441 is first formed on silicon oxide film 401. In this step, a center (alternate long and short dash line N—N) of hole pattern 441a in resist pattern 441 may cause a lateral shift $L_I$ within a range of 0.18 μm with respect to an alignment center (alternate long and two short dashes line M—M). If this shift $L_I$ exceeds the aforementioned overlap margin of 0.1 μm, the state shown in FIG. 33 occurs.

Referring to FIG. 33, if contact hole 401a is formed in silicon oxide film 401 with the mask formed of resist pattern 441 of which shift $L_I$ is 0.1 μm or more, the side surface of word line 23 is exposed on the sidewall of contact hole 401a. When resist pattern 441 is removed from the structure in this state, and contact hole 401a is filled with plug layer 409a, plug layer 409a and word line 23 are short-circuited as shown in FIG. 34.

Under the above conditions, plug layer 409a may be connected to channel stopper region 35.

FIGS. 35 and 36 are schematic cross sections showing the state in which the plug layer and the channel cut region are connected together, in accordance with the order of steps. Referring first to FIG. 32, if the center (alternate long and short dash line N—N) of hole pattern 441a is shifted leftward by a distance of 0.18 μm from the alignment center (alternate long and two short dashes line), the structure shown in FIG. 35 will be formed.

Referring to FIG. 35, a part of the surface of channel stopper region 35 is exposed at the bottom of contact hole 401a. Subsequently, resist pattern 441 is removed, and contact hole 401a is filled with plug layer 409a, so that plug layer 409a and channel stopper region 35 are connected together as shown in FIG. 36.

From the above description, it is apparent that distances such as the size $L_G$ between contact hole 401a and word line 23 must be large in order to prevent connection between plug layer 409a and word line 23 and connection between plug layer 409a and channel stopper region 35. Therefore, the distance $L_0$ is necessarily large, which increases a planar area occupied by memory cells.

Further, if contact hole 401a is formed with a shifted or dislocated mask, contact hole 401a may protrude from a region at which lower electrode layer 413 is formed.

FIGS. 37A and 37B are schematic plan views showing a state where the contact hole protrudes from the formation region of the lower electrode layer. Referring to FIG. 37A, it has been studied to from contact hole 401a, which has a width $L_Q$ of 1 μm and a length $L_R$ of 0.5 μm, above lower electrode layer 413. An open diameter $L_F$ of contact hole 401a is 0.4 μm due to the limit by the photolithography. Therefore, if contact hole 401a is dislocated in the direction indicated by arrow P due to the shift of mask, it is very likely that contact hole 401a protrudes from the formation region of lower electrode layer 413 as shown at FIG. 37B.

In general, the size of lower electrode layer 413 is set small so as to comply with high integration. Nevertheless, as shown at FIG. 37B, contact hole 401a protrudes from the formation region of lower electrode layer 413, so that the protrusion impedes higher integration.

Accordingly, the conventional semiconductor device is not suitable to higher integration.

Third problem is that the breakdown voltage characteristics of interlayer insulating film 401 is degraded.

The conventional semiconductor device uses the silicon oxide film as interlayer insulating film 401. The etching selectivity of silicon oxide film is small similarly to titanium forming barrier layer 411. Therefore, when lower electrode layer 413 and barrier layer 411 are etched and removed by the process shown in FIG. 28, interlayer insulating film 401 is also etched and removed.

FIG. 38 is a schematic cross section showing a state where the interlayer insulating film is removed by the etching simultaneously with the patterning of the lower electrode layer and others. Referring to FIG. 38, if the interlayer insulating film 401 is selectively removed by etching together with the intended layers, the film thickness S of silicon oxide film 401 above buried bit line 37 is reduced, or, in the worst case, buried bit line 37 is exposed. If the film thickness S of silicon oxide film 401 above buried bit line 37 is reduced, the insulating property and breakdown voltage between the capacitor, which will be formed later, and buried bit line will be degraded.

SUMMARY OF THE INVENTION

An object of the present invention is to obtain good characteristics relating to breakdown voltage and resistance to leakage between a lower electrode layer and an upper electrode layer forming a capacitor.

Another object of the invention is to provide a semiconductor device suitable to high integration.

Still another object of the invention is to prevent reduction of insulating property and breakdown voltage of an interlayer insulating film.

A method of manufacturing a semiconductor device according to a first aspect of the invention includes the following steps.

First, an impurity region is formed at a main surface of a silicon substrate. A first insulating film is formed on the main surface of the silicon substrate to cover the impurity region. A second insulating film having different etch characteristics, from those of the first insulating film is formed on the first insulating film. A first cover film is formed on the second insulating film. The first cover film has etch characteristics substantially equal to those of the first insulating film, and has a first hole located above the impurity region. A second cover film having etch characteristics substantially equal to those of the first cover film is formed on the inner surface of the first hole and the surface of the first cover film.

Anisotropic etching is effected on the second cover film to expose a portion of the surface of the second insulating film at the bottom of the first hole, so that a sidewall film covering the sidewall of the first hole is formed. Anisotropic etching is effect on a portion of the second insulating film, which is exposed at the bottom of the first hole, to expose a part of the surface of the first insulating film, using the sidewall film and the first cover film as a mask, so that a second hole is formed in the second insulating film. Anisotropic etching is effected on a portion of the first insulating film exposed at the bottom of the second hole to expose a part of the surface of the impurity region, so that a third hole is formed in the second insulating film, and the first cover film and the sidewall film are removed. A conductive film having etch characteristics substantially equal to those of the second insulating film is formed on the second insulating film to fill second and third holes. Etching is effected on the whole surface of the conductive film to expose at least the surface of the second insulating film, so that the conductive film is left in the second and third holes with the surface substantially flush with the surface of the second insulating film. A lower electrode layer is formed on the second insulating film to be in contact with the conductive layer. A capacitor insulating layer containing high permittivity dielectric material is formed to cover the lower electrode layer. An upper electrode layer is formed to cover the lower electrode layer with the capacitor insulating layer therebetween.

According to the method of manufacturing the semiconductor device of the first aspect of the invention, the insulating film covering the impurity region is formed of the first and second insulating films. The second insulating film between them has the etch characteristics substantially equal to those of the conductive film formed on the second insulating film. Therefore, when the whole surface of the conductive layer is etched to from the plug layer filling only the second and third holes, the second insulating film has the top surface substantially flush with the top surface of the plug layer produced from the conductive layer. Thus, the etching of the conductive film for forming the plug layer generally over-etches the conductive film, and the conductive film and the second insulating film are over-etched and removed by the substantially equal amount measured from the original top surface of the second insulating film, because both films have substantially the same etch characteristics. Therefore, the top surface of the second insulating film and the top surface of the plug layer form the substantially same plane.

As described above, the second insulating film and the conductive film have substantially the same plane, i.e., substantially flat surface, so that a recess at which the top surface of the second insulating film is located lower than the top surface of the plug layer is not formed at the second and third holes in contrast to the prior art manufacturing method. Accordingly, it is possible to prevent degradation of anti-leak characteristics and breakdown voltage characteristics which may be caused by coverage of the lower electrode layer and the capacitor insulating layer at the recess.

Further, according to the method of manufacturing the semiconductor device of the first aspect of the invention, the first insulating film having the first hole is formed on the second insulating film. The first hole is formed by, for example, the photolithography. Therefore, an open diameter of the first hole cannot be smaller than the minimum processible size attained by the photolithography. However, the open diameter can be smaller by double the widths of the sidewall film than the minimum size attained by the photolithography. Anisotropic etching is effected on the second insulating film with the mask formed of the first cover film having such hole or opening and the sidewall film. By this etching the second and third holes are formed, of which open diameters are smaller than the minimum processible size attained by the photolithography, at the first and second insulating films, respectively. Thereby, the second and third holes can be formed at a narrower space in accordance with the same design rule, and the overlapping margin in the photolithographic patterning process can be increased.

A semiconductor device according to a first aspect of the invention includes a semiconductor substrate, an impurity region, a first insulating film, a second insulating film, a buried conductive layer, a lower electrode layer, a capacitor insulating layer and an upper electrode layer. The semiconductor substrate has a main surface. The impurity region is formed at the main surface of the semiconductor substrate. The first insulating film is formed on the main surface of the semiconductor substrate to cover the impurity region, and has a first hole reaching a portion of the surface of the impurity region. The second insulating film is formed on the first impurity film, and has a second hole communicating with the first hole. The first and second holes have an open diameter smaller than a minimum processible diameter attained by photolithography, and extend from the top surface of the second insulating film to the impurity region. The buried conductive layer is in contact with a portion of the surface of the impurity region, fills the first and second holes and has a surface substantially flush with the top surface of the second insulating film. The lower electrode layer is in contact with the buried conductive layer and is formed on the top surface of the second insulating film. The capacitor insulating layer covers the lower electrode layer, and contains high permittivity dielectric material. The upper electrode layer covers the lower electrode layer with the capacitor insulating layer therebetween.

In the semiconductor device according to the first aspect of the invention formed by the aforementioned manufacturing method, the buried conductive layer (plug layers) filling the first and second holes have the top surface which is substantially flush with the top surface of the second insulating film. Thus, the top surface of buried conductive layer located at the upper portion of the first and second holes is not recessed with respect to the top surface of the second insulating film. Thus, the top surfaces of the buried conductive layer and the second insulating film do not form a step. Therefore, there is no degradation of the anti-leak characteristics and breakdown voltage characteristics, which may be caused by the step coverage of the lower electrode layer and capacitor insulating layer at the step. Accordingly, the semiconductor device can have good anti-leak characteristics and good breakdown voltage characteristics.

In the semiconductor device according to the first aspect of the invention formed by the aforementioned manufacturing method, the first and second holes have the open diameter smaller than the minimum processible diameter attained by the photolithography. Therefore, even if the first and second holes are formed between word lines in a memory cell of a DRAM, a margin allowing overlap of the holes and the word lines can be increased correspondingly to the reduction of size of the open diameter. Therefore, a pitch between the word lines can be reduced, so that the memory cells and others can be integrated to a higher extent. Accordingly, it is possible to obtain the semiconductor device which can comply with the high integration.

According to the semiconductor device of a preferred aspect of the invention, the second insulating film is made of a material containing a silicon nitride film.

In the conventional semiconductor device, a single layer of a silicon oxide film is used as an interlayer insulating film covering a transfer gate transistor. In general, a barrier layer made of titanium (Ti) or the like is formed between the interlayer insulating film and the lower electrode layer. The titanium or the like forming the barrier layer and the silicon oxide film have a small etching selectivity. Therefore, when the barrier layer is removed by etching during the patterning process for forming the lower electrode layer, the interlayer insulating film made of the silicon oxide film is simultaneously removed. Due to reduction of the film thickness of the silicon oxide film, the insulating property and breakdown voltage of the silicon oxide film degrade.

According to the semiconductor device of the preferred aspect of the invention, however, the second insulating film is made of the material containing the silicon nitride film. This silicon nitride film has an etching selectivity larger than the titanium or the like forming the barrier layer. Therefore, when the barrier layer is etched in the patterning process for forming the lower electrode layer, the second insulating film made of the silicon nitride film is hardly removed. Consequently, the film thickness of the second insulating film is not reduced, and thus the insulating property and breakdown voltage do not degrade. Accordingly, the semiconductor device can have the good insulating property and breakdown voltage.

A method of manufacturing a semiconductor device according to another aspect of the invention includes the following steps.

An impurity region is first formed on a main surface of a semiconductor substrate. An insulating film which covers the impurity region and has a hole reaching the impurity region is formed on the main surface of the semiconductor substrate. A conductive film having etch characteristics substantially equal to those of the insulating film is formed on the insulating film to fill the hole. The whole surface of the conductive film is etched to expose at least the surface of the insulating film, so that the conductive film remains in the hole with its surface substantially flush with the surface of the insulating film. A lower electrode layer is formed on the insulating film to be in contact with the conductive film. A capacitor insulating layer containing high permittivity dielectric material is formed to cover the lower electrode layer. An upper electrode layer is formed to cover the lower electrode layer with the capacitor insulating layer therebetween.

According to the method of manufacturing the semiconductor device of the above aspect of the invention, the insulating film covering the impurity region has the etch characteristics substantially equal to those of the conductive film formed on the insulating film. Therefore, when the whole surface of the conductive film is etched to form the plug layer filling the hole only, the insulating film has the top surface substantially flush with the top surface of the plug layer made of the conductive layer. Thus, in the process of etching the conductive film for forming the plug layer, the conductive film is generally over-etched, but the conductive film and the insulating film are over-etched and removed by the substantially same amount measured from the original top surface of the insulating film, because both films have substantially equal etch characteristics. Therefore, the top surface of the insulating film and the top surface of the plug layer form substantially the same plane.

Since the top surfaces of the insulating film and conductive film form substantially the same plane and thus substantially flat plane, a recess, at which the top surface is lower than the top surface of the insulating film, is not formed. Accordingly, it is possible to prevent degradation of the anti-leak characteristics and breakdown voltage characteristics, which may be caused by the step coverage of the lower electrode layer and capacitor insulating layer at the recess.

A semiconductor device according to another aspect of the invention includes a semiconductor substrate, an impurity region, an insulating film, a buried conductive layer, a lower electrode layer, a capacitor insulating layer and an upper electrode layer. The semiconductor substrate has a main surface. The impurity region is formed on the main surface of the semiconductor substrate. The insulating film is formed on the main surface of the semiconductor substrate to cover the impurity region, and has a hole reaching a portion of the surface of the impurity region. The buried conductive layer fills the hole, is in contact with a portion of the surface of the impurity region, has a surface substantially flush with the top surface of the insulating film, and has etch characteristics substantially equal to those of the insulating film. The lower electrode layer is formed on the top surface of the insulating film and is in contact with the buried conductive layer. The capacitor insulating layer covers the lower electrode layer, and contains high permittivity dielectric material. The upper electrode layer covers the lower electrode layer with the capacitor insulating layer therebetween.

The semiconductor device according to the above aspect of the invention manufactured by the aforementioned method, the top surface of the buried conductive layer (plug layer) filling the hole and the top surface of the insulating film form substantially the same plane. In other words, the top surface of the buried conductive film at the upper portion of the hole is not recessed from the top surface of the insulating film. Thus, the top surface of the buried conductive layer and the top surface of the insulating film do not form a step. Therefore, it is possible to prevent degradation of the anti-leak characteristics and breakdown voltage characteristics, which may be caused by the step coverage of the lower electrode layer and the capacitor insulating layer at the step in the prior art. Accordingly, the semiconductor device can have good anti-leak characteristics and good breakdown voltage characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of a semiconductor device and a method of manufacturing the same according to the invention will be described below with reference to the drawings.

Figure 1:
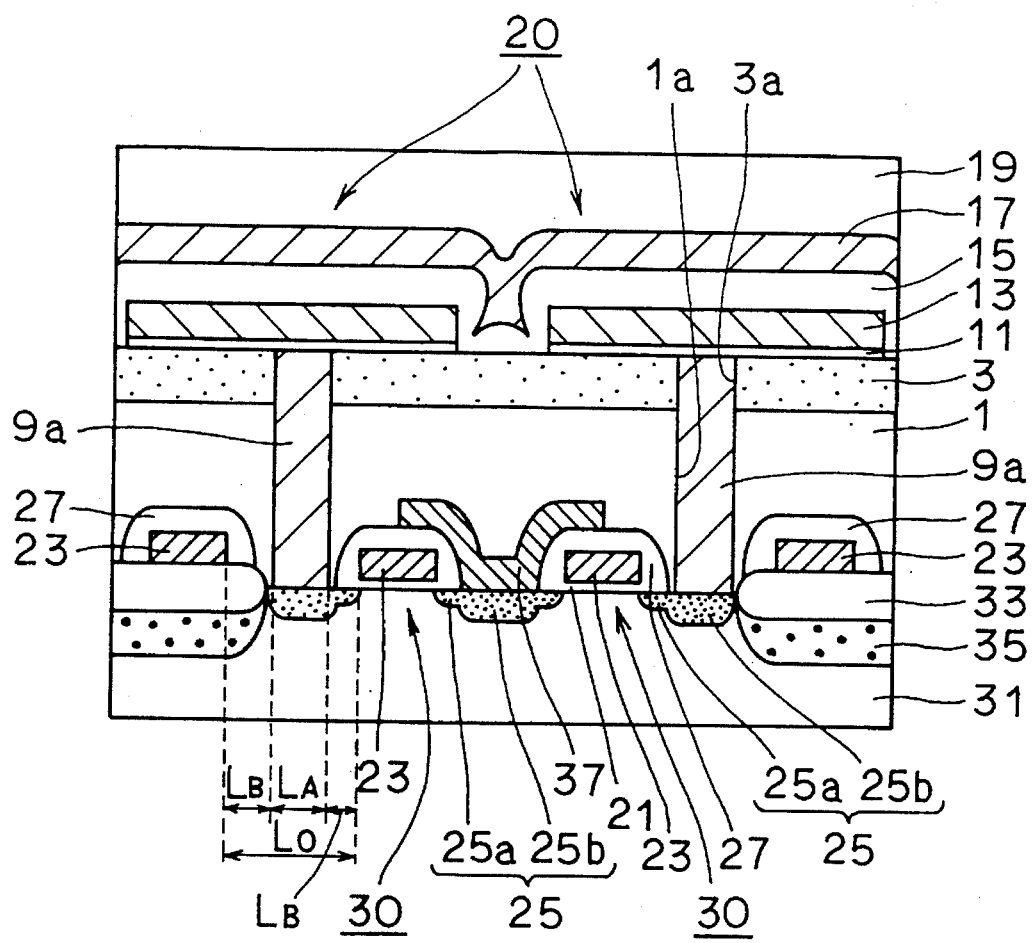
FIG. 1 is a cross section schematically showing a structure of a semiconductor device of a first embodiment of the invention.

Referring to FIG. 1, a silicon substrate 31 is provided at its surface with isolating oxide films 33. There are also provided channel stopper regions 35 being in contact with bottom surfaces of isolating oxide films 33. A plurality of transfer gate transistors 30 are formed at a portion of the surface of silicon substrate 31 electrically isolated from other portions by isolating oxide films 33 and channel stopper regions 35.

Each transfer gate transistor 30 has a gate oxide film 21, a gate electrode 23 and a pair of source/drain regions 25. Paired source/drain regions 25 are formed at the surface of silicon substrate 31 with a predetermined space between each other. Source/drain regions 25 have an LDD structure. Thus, each of source/drain regions 25 is formed of a two-layer structure including a relatively lightly doped impurity region 25a and a relatively heavily doped impurity region 25b. A gate electrode 23 is formed on a region located between each pair of source/drain regions 25 with a gate oxide film 21 therebetween. The surface of each gate electrode 23 is covered with an insulating film 27.

A bit line 37 extends on the surface of insulating film 27 and is in contact with one of source/drain regions 25. Bit line 37 and transfer gate transistors 30 are covered with interlayer insulating films 1 and 3.

Interlayer insulating films 1 and 3 are specifically a silicon oxide film ($SiO_2$) 1 and a silicon nitride film ($Si_3N_4$) 3. The silicon oxide film 1 and silicon nitride film 3 are successively deposited. Bit line 37 is covered with interlayer insulating films 1 and 3 as described above and thus is in the form of a buried bit line.

Silicon oxide film 1 and silicon nitride film 3 are provided with contact holes 1a and 3a, respectively. Each contact hole 1a and 3a reaches a portion of the surface of the other of source/drain regions 25. Contact hole 1a and 3a, i.e., hole 1a formed in silicon oxide film 1 and hole 3a formed in silicon nitride film 3 is communicated with each other. Contact hole 1a and 3a has an open diameter smaller than a minimum processible diameter attained by the photolithography. There are provided plug layers 9a which fill contact holes 1a and 3a and thus are in contact with source/drain regions 25.

The top surface of each plug layer 9a is substantially flush with the top surface of silicon nitride film 3. Plug layer 9a is made of doped polycrystalline silicon. Capacitors 20 are electrically connected to source/drain regions 25 through plug layers 9a.

Each capacitor 20 includes a lower electrode layer 13, a capacitor insulating layer 15 and an upper electrode layer 17. Lower electrode layer 13 is formed on the surface of silicon nitride film 3 with a barrier layer 11 therebetween and has a film thickness from 300 to 1000 Å. Lower electrode 13 is made of platinum (Pt).

Barrier layer 11 has a three-layer structure including a titanium (Ti) layer, a titanium nitride (TiN) layer and a titanium (Ti) layer, and is in contact with plug layers 9a. A film thickness of each film forming barrier layer 11 is in a range from 100 to 500 Å. Barrier layer 11 serves to prevent diffusion of impurity from plug layers 9a made of doped polycrystalline silicon into lower electrode layer 13, and also serves to improve adhesion between silicon nitride film 3 and lower electrode layer 13.

The surface of lower electrode layer 13 is covered with capacitor insulating layer 15. Capacitor insulating layer 15 is made of high permittivity dielectric material such as PZT. Upper electrode layer 17 covers lower electrode layer 13 with capacitor insulating layer 15 therebetween. The upper electrode layer 17 may be made of platinum, or may be made of doped polycrystalline silicon. Capacitor 20 is covered with an insulating film 19.

A method of manufacturing the semiconductor device of the first embodiment will be described below.

Figure 2:
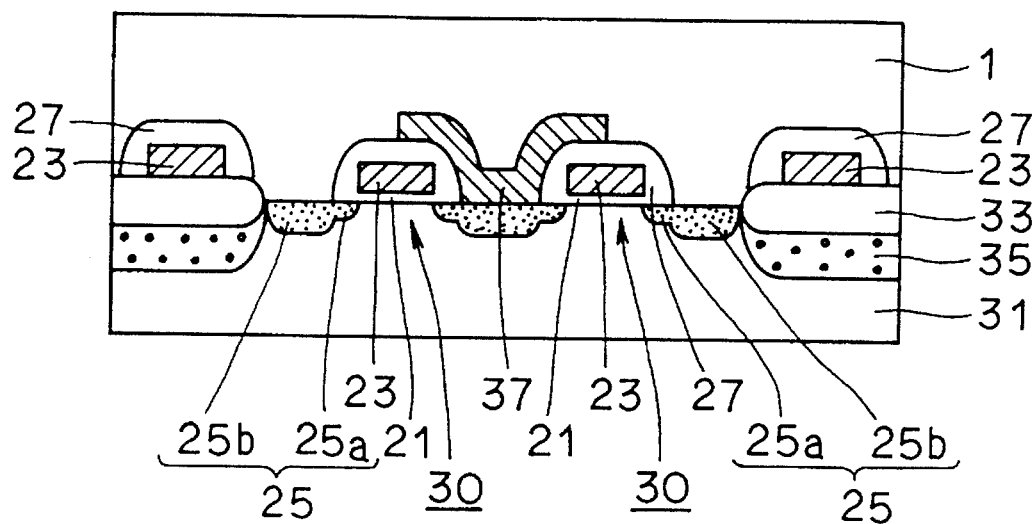
FIGS. 2 to 14 are schematic cross sections showing a process of manufacturing the semiconductor device of the first embodiment of the invention in accordance with the order of the steps.

Referring first to FIG. 2, transfer gate transistor 30 including gate oxide film 21, gate electrode 23 and a pair of source/drain regions 25 is formed at the region of silicon substrate 31 isolated by isolating oxide film 33 and channel stopper region 35. Bit line 37 is formed such that it extends on the surfaces of insulating film 27 covering the surfaces of gate electrode 23 and is in contact with one of source/drain regions 25. Bit line 37 is formed of, e.g., a doped polycrystalline silicon film.

A low pressure CVD method is performed to form silicon oxide film 1 on the whole surface of silicon substrate 31 to cover bit line 37 and transfer gate transistor 30. An SOG film (not shown) is applied to the surface of silicon oxide film 1 for forming a relatively flat surface. Thereafter, etchback is effected on the SOG film and silicon oxide film 1 to complete silicon oxide film 1 having a substantially flat top surface.

Figure 3:
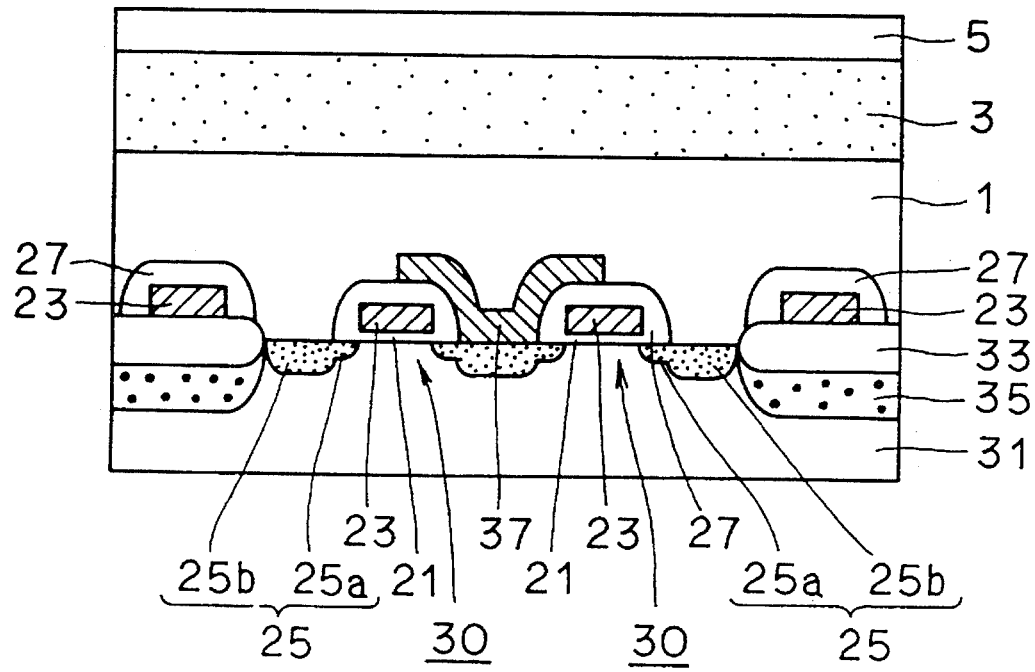

Referring to FIG. 3, silicon nitride film ($Si_3N_4$) 3 from 1000 to 3000 Å in thickness is formed on the surface of silicon oxide film 1 by low pressure CVD method or normal pressure CVD method. Silicon oxide film 5 from 500 to 3000 Å in thickness is formed on the whole surface of silicon nitride film 3 by low pressure CVD method or normal pressure CVD method.

Figure 4:
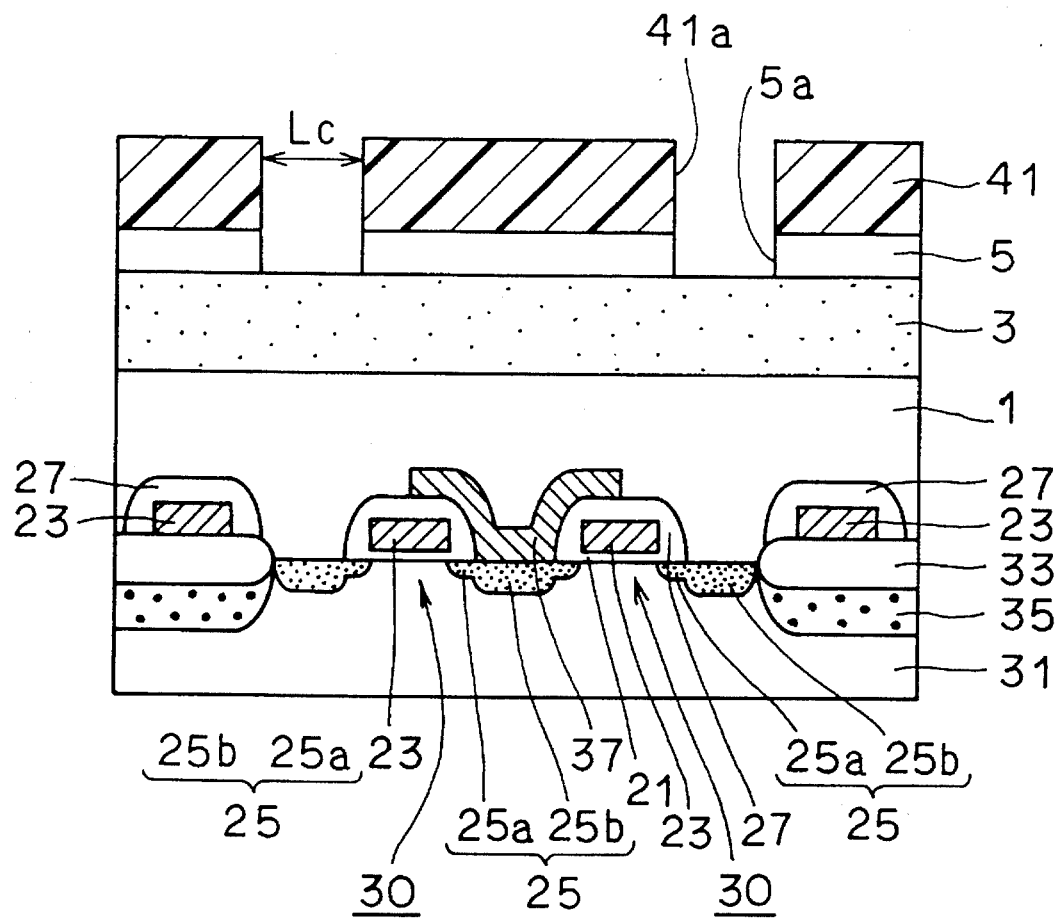

Referring to FIG. 4, photoresist 41 is applied to the whole surface of silicon oxide film 5. Photoresist 41 is patterned, e.g., by exposure to have hole patterns 41a located above source/drain regions 25. Anisotropic etching is effected on silicon oxide film 5 using resist pattern 41 as a mask. By this etching, openings 5a are formed in silicon oxide film 5. Thereafter, resist pattern 41 is removed.

Figure 5:
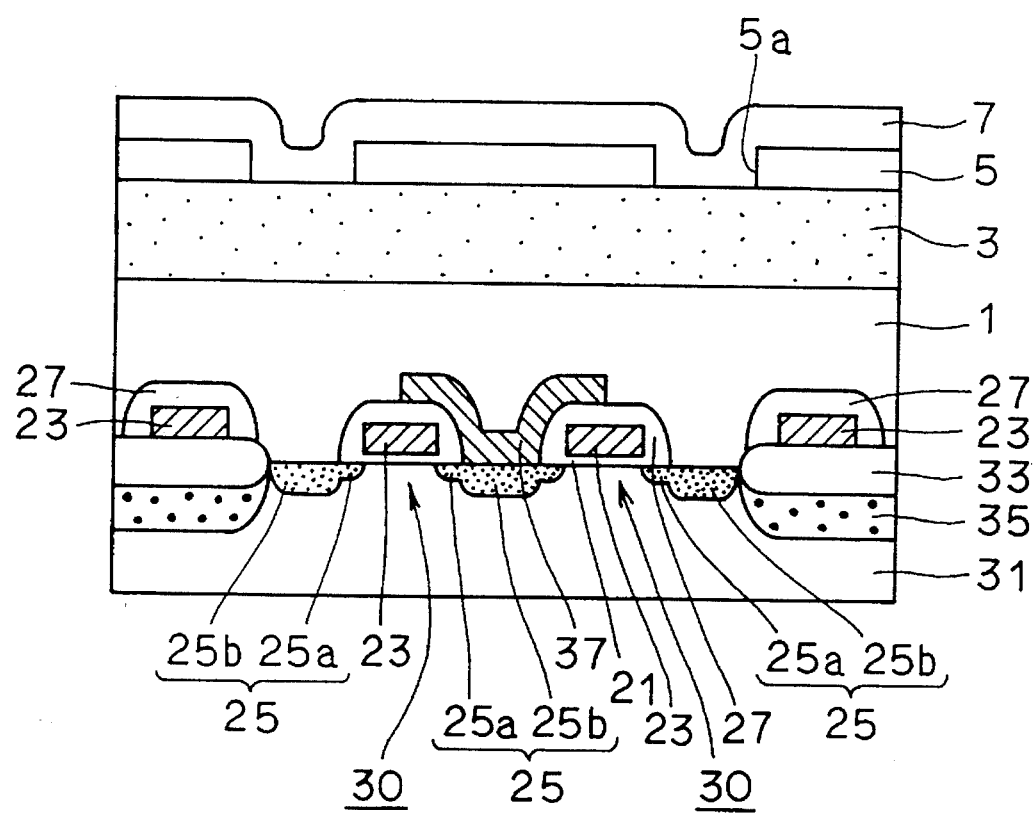

Referring to FIG. 5, low pressure CVD method is performed to form a second silicon oxide film 7 which has a film thickness from 500 to 1500 Å and covers inner walls of openings 5a and the whole surface of silicon oxide film 5. Etchback is effected on second silicon oxide film 7 to expose at least the surface of silicon nitride film 3 at the bottom of opening 5a.

Figure 6:
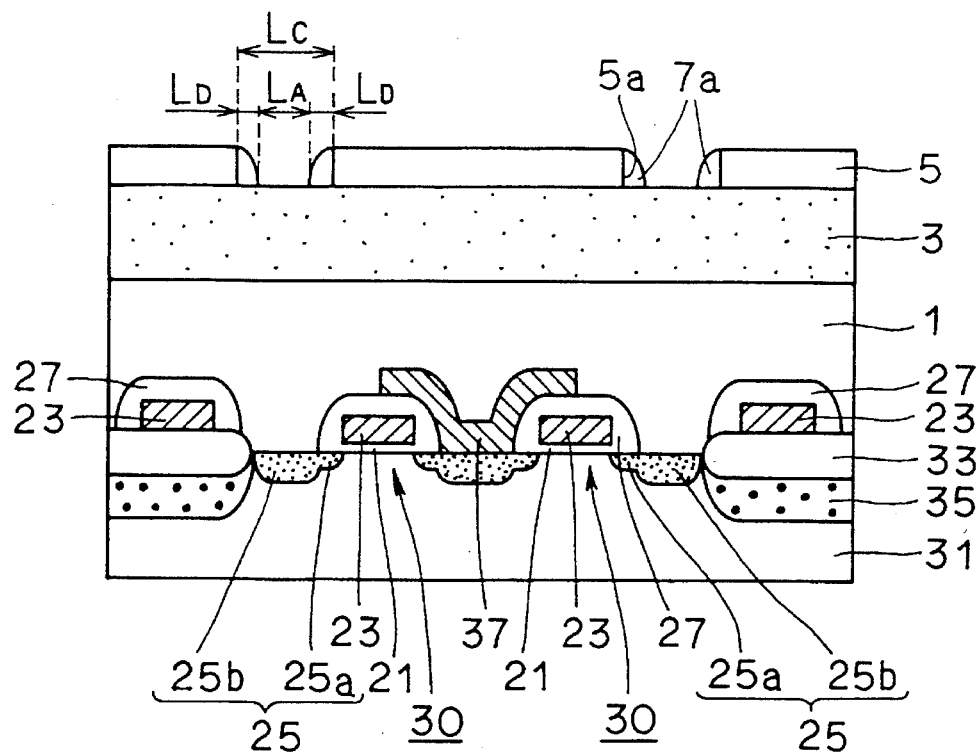

Referring to FIG. 6, by this etchback frame 7a of a sidewall spacer configuration having a width $L_D$ from 500 to 1500 Å is formed on sidewalls of opening 5a. Frame 7a reduces an open diameter $L_C$ of opening 5a to an opening diameter $L_A$. Using frame 7a and first silicon oxide film 5 as a mask, anisotropic etching is effected on silicon nitride film 3.

Figure 7:
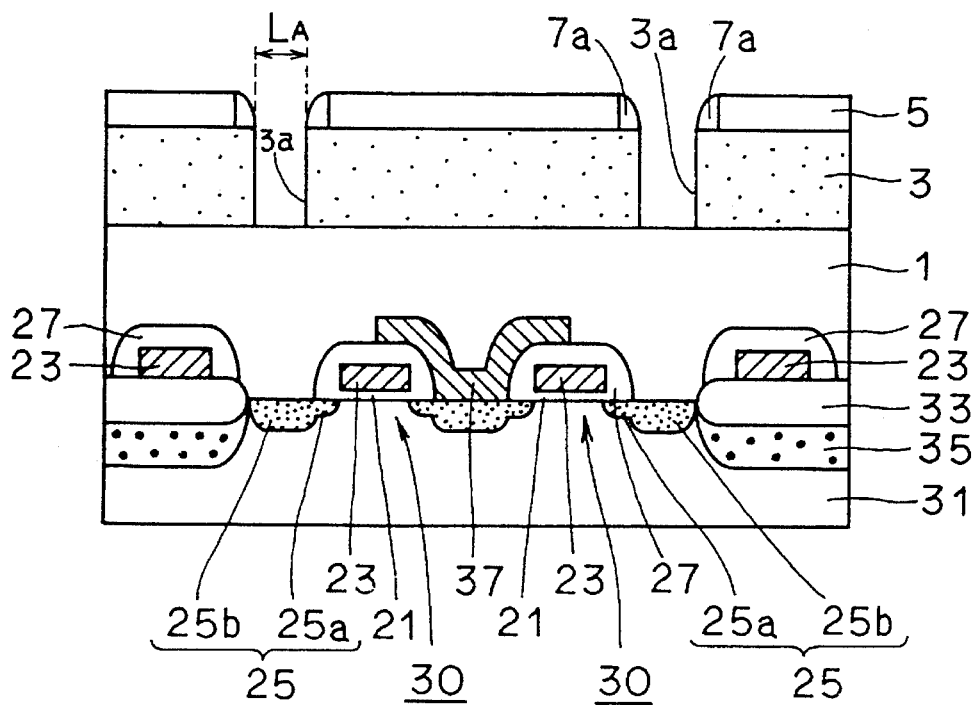

Referring to FIG. 7, by this anisotropic etching in silicon nitride film 3 second opening 3a is formed which exposes portions of the surface of silicon oxide film 1. Thereby, second hole 3a has an open diameter substantially equal to opening diameter $L_A$. Then, anisotropic etching is effected on silicon nitride film 1 using silicon nitride film 3 as a mask. First cover film 5 and frame 7a are removed simultaneously with this etching of silicon oxide film 1.

Figure 8:
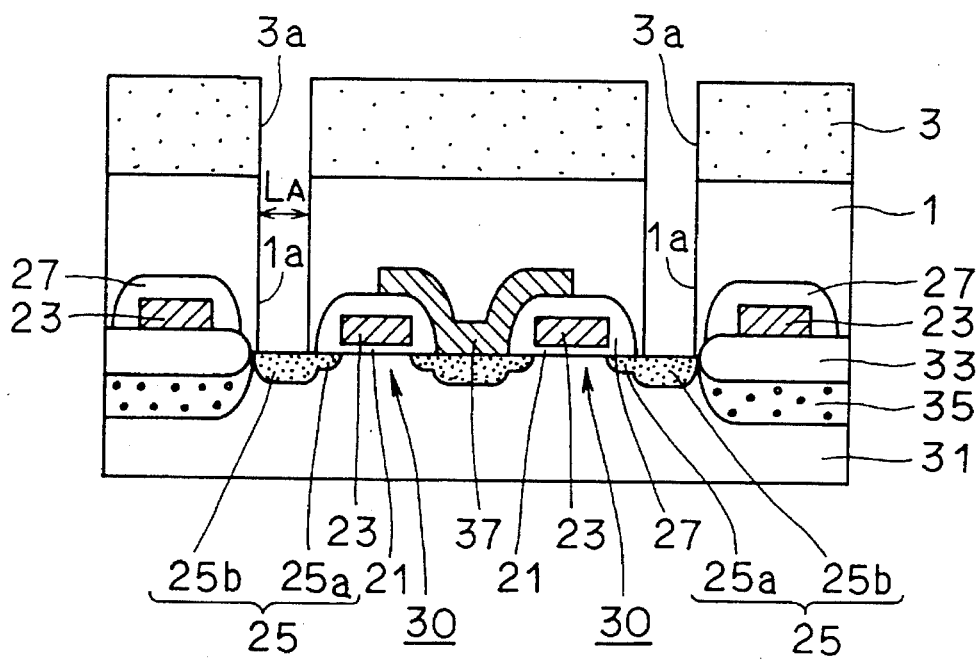

Referring to FIG. 8, first hole 1a is formed in silicon oxide film 1 by etching silicon oxide film 1. First holes 1a has an open diameter substantially equal to open diameter $L_A$. Surfaces of source/drain regions 25 are partially exposed through first holes 1a. Thus, first and second holes 1a and 3a form the contact holes reaching the surfaces of source/drain regions 25.

Figure 9:
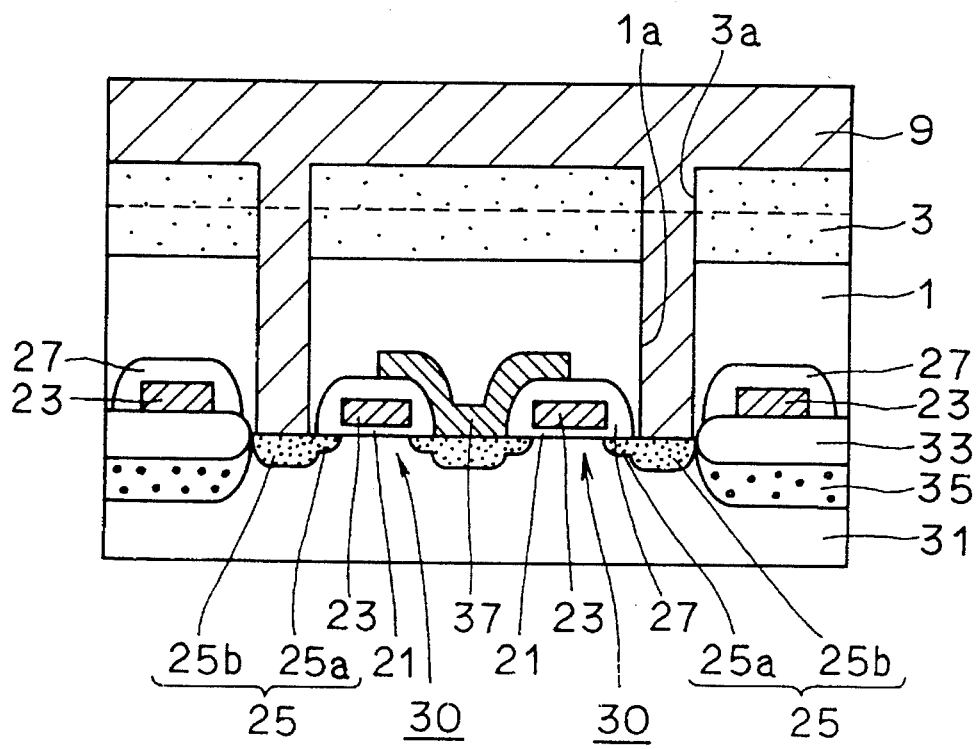

Referring to FIG. 9, CVD method is performed to form doped polycrystalline silicon film 9 from 5000 to 6000 Å in thickness on the whole surface of silicon nitride film 3 to fill contact holes 1a and 3a. Etchback is effected on doped polycrystalline silicon film 9 to form plug layers filling contact holes 1a and 3a.

In this etching process, over-etching is effected on doped polycrystalline silicon film 9 to the level indicated by dotted line, for example, in order to remove etching residue from the top surface of silicon nitride film 3 above a stepped portion (not shown in FIG. 9) of doped polycrystalline silicon film 9. This etching is performed under the conditions suitable to mass production, and for example, by RIE of the parallel plate type with gas system of $SF_6$, supply rate of $SF_6$ of 100 sccm, gas pressure of 500 mTorr, RF power of 200 W, for 1 to 2 minutes and input power of 0.25 W/cm$^2$. An etch rate of doped polycrystalline silicon film 9 is from 4000 to 6000 Å/min.

Figure 10:
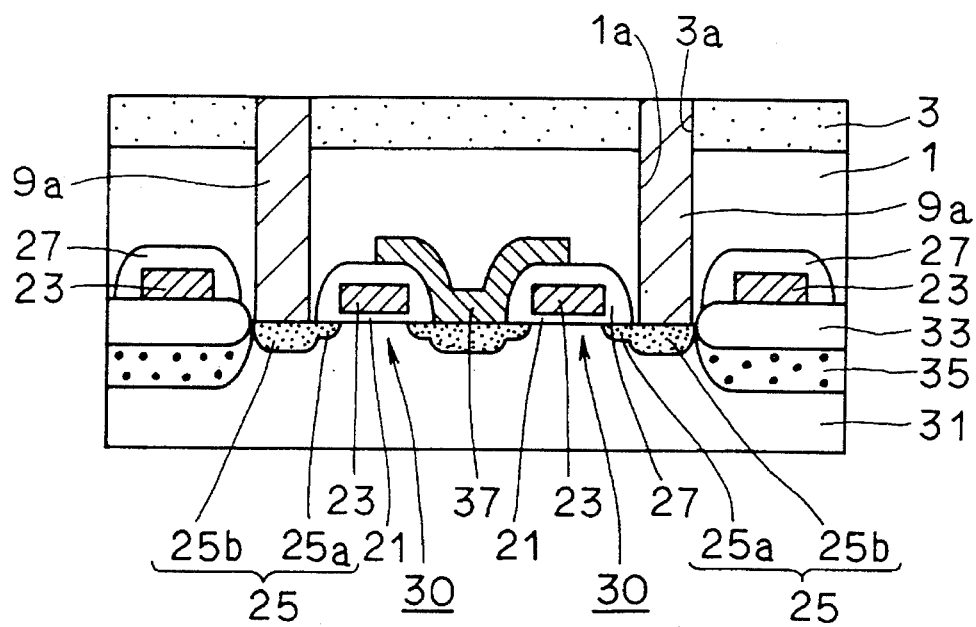

Referring to FIG. 10, an etching selectivity of doped polycrystalline silicon film (Poly-Si) 9 with respect to silicon nitride film ($Si_3N_4$) 3, i.e., (etch rate of Poly-Si)/(etch rate of $Si_3N_4$) is from 1 to 2 under these conditions. Under these conditions, doped polycrystalline silicon film 9 and silicon nitride film 3 have a remarkably small etching selectivity. Therefore, by the over-etching in the aforementioned etchback process, both films 3 and 9 are removed by the same film thickness from the original top surface level of silicon nitride film 3. Since the etching selectivity of both films 3 and 9 is small, such a situation is prevented that only doped polycrystalline silicon film 9 is excessively etched due to the loading effect. Therefore, the top surface of plug layers 9a and silicon nitride film 3 formed by the etchback form substantially the same plane.

Figure 11:
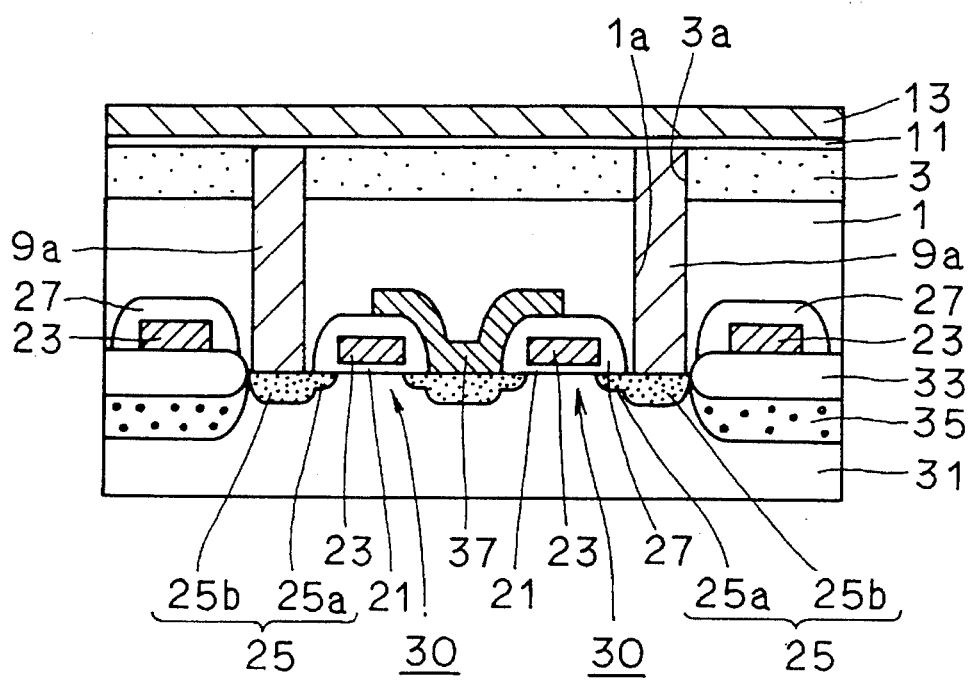

Referring to FIG. 11, barrier layer 11, i.e., three layers including the titanium layer, titanium nitride layer and titanium layer each having a thickness from 100 to 500 Å are sequentially formed by the sputtering method on the whole top surface defined by plug layers 9a and silicon nitride film 3. Platinum layer 13 having a thickness from 300 to 1000 Å is formed on the whole surface of barrier layer 11 by sputtering method.

Figure 12:
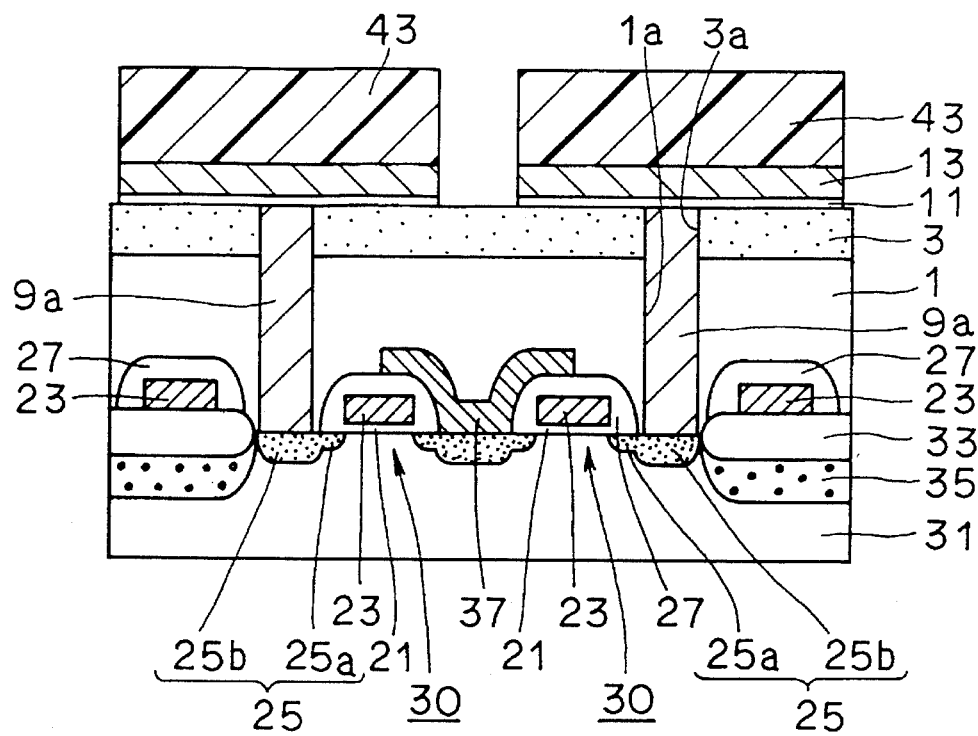

Referring to FIG. 12, a resist pattern 43 patterned into an intended configuration is formed on the surface of platinum layer 13. Using resist pattern 43 as a mask, anisotropic etching is successively effected on platinum layer 13 and barrier layer 11 for patterning. By this patterning lower electrode layers 13 are formed which are made of platinum and are electrically connected to source/drain regions 25 through plug layers 9a. In connection with the patterning, titanium and others forming barrier layer 11 as well as silicon nitride film 3 have a large etching selectivity. Therefore, silicon nitride film 3 is hardly removed by the aforementioned etching. Accordingly, degradation of the insulating property and breakdown voltage, which may be caused by reduction of the film thickness of silicon nitride film 3, is prevented. Thereafter, resist pattern 43 is removed.

Figure 13:
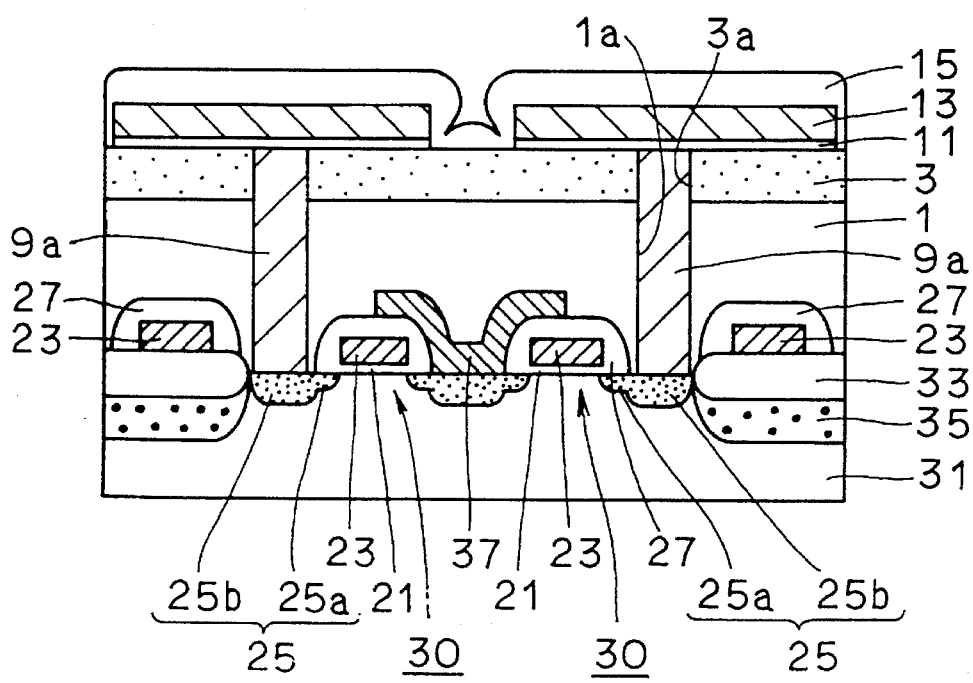

Referring to FIG. 13, sputtering is performed to form a capacitor insulating layer 15 made of high permittivity dielectric material such as PZT and covering the surfaces of lower electrode layer 13.

Figure 14:
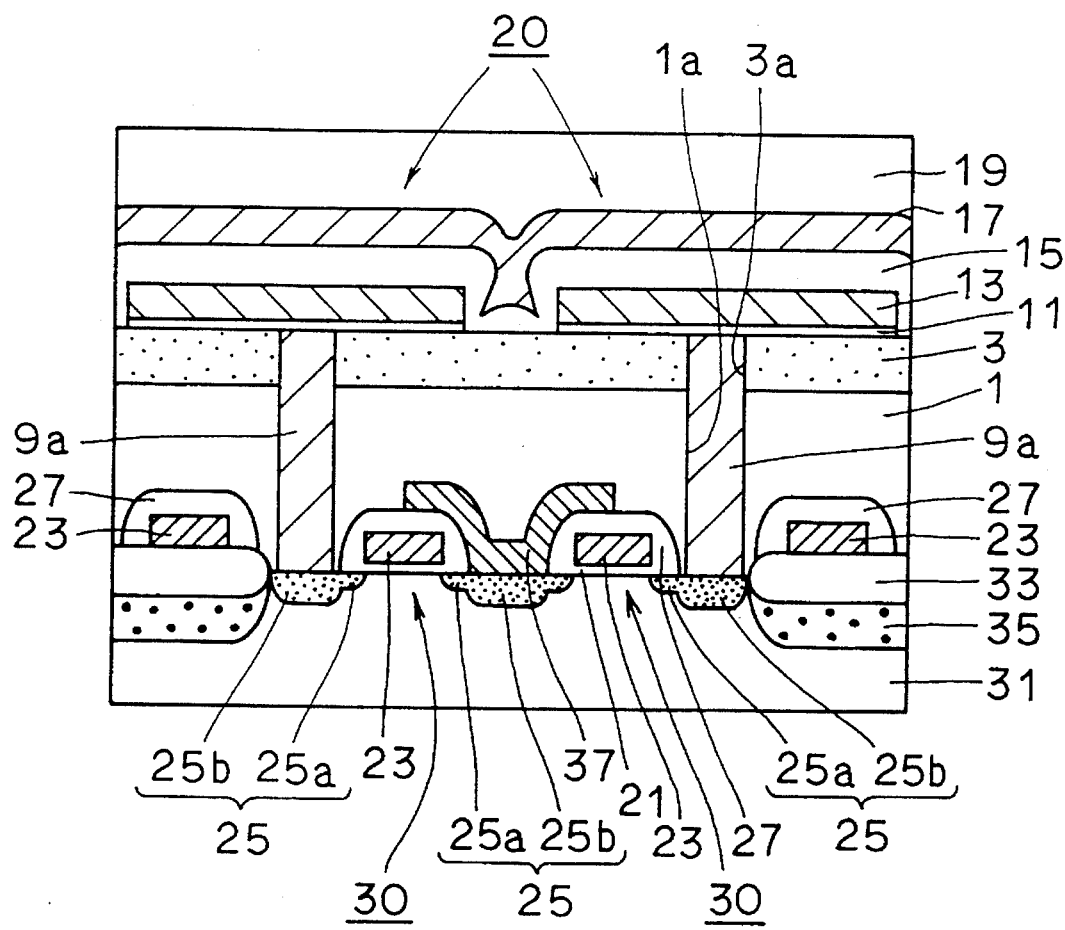

Referring to FIG. 14, upper electrode layer 17 made of platinum or doped polycrystalline silicon is formed to cover lower electrode layer 13 with capacitor insulating layer 15 therebetween. Thereby, capacitor 20 formed of lower electrode layer 13, capacitor insulating layer 15 and upper electrode layer 17 is completed. Insulating film 19 is formed to cover capacitor 20.

In the method of manufacturing the semiconductor device of this embodiment, as shown in FIG. 9, doped polycrystalline silicon film 9 for forming pug layers is formed on silicon nitride film 3. Under the etching conditions described before, the etching selectivity of doped polycrystalline silicon film 9 with respect to silicon nitride film 3 is from 1 to 2. Therefore, when over-etched in the etchback process, doped polycrystalline silicon film 9 and silicon nitride film 3 are removed by substantially equal thickness from the original top surface level of silicon nitride film 3. Accordingly, as shown in FIG. 10, a step is not formed between the top surface of plug layer 9a and the top surface of silicon nitride film 3 after the etching.

The etching selectivity of doped polycrystalline silicon film 9 with respect to silicon nitride film 3 is about one tenth of the etching selectivity of the same with respect to the silicon oxide film. Accordingly, even if a step is formed between the top surfaces of plug layers 9a and silicon nitride film 3 after the etching in the manufacturing method of this embodiment, difference in level at this step of this embodiment is about one tenth of a difference r in level at the step in the prior art.

Figure 26:
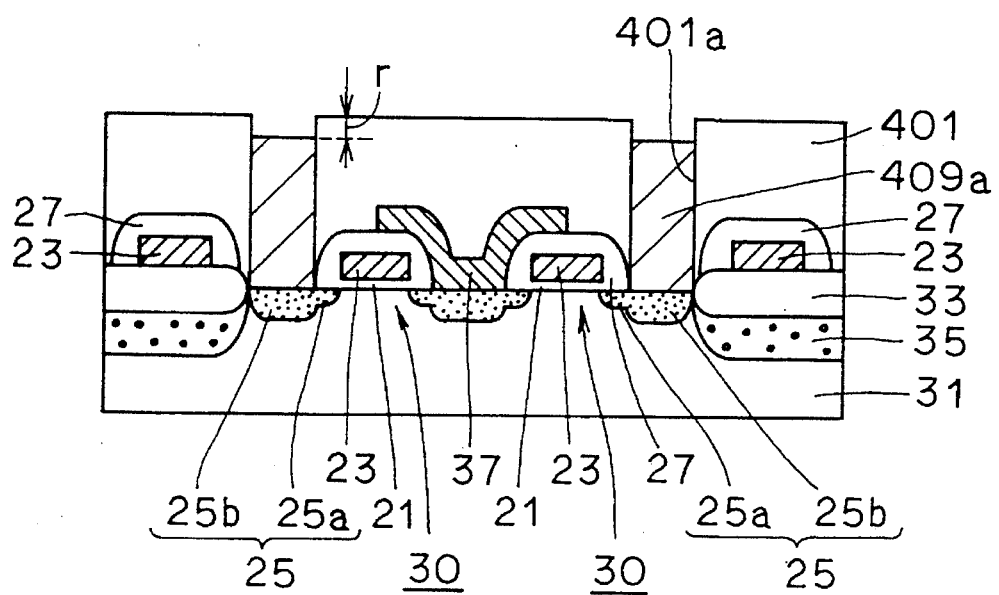
Figure 27:
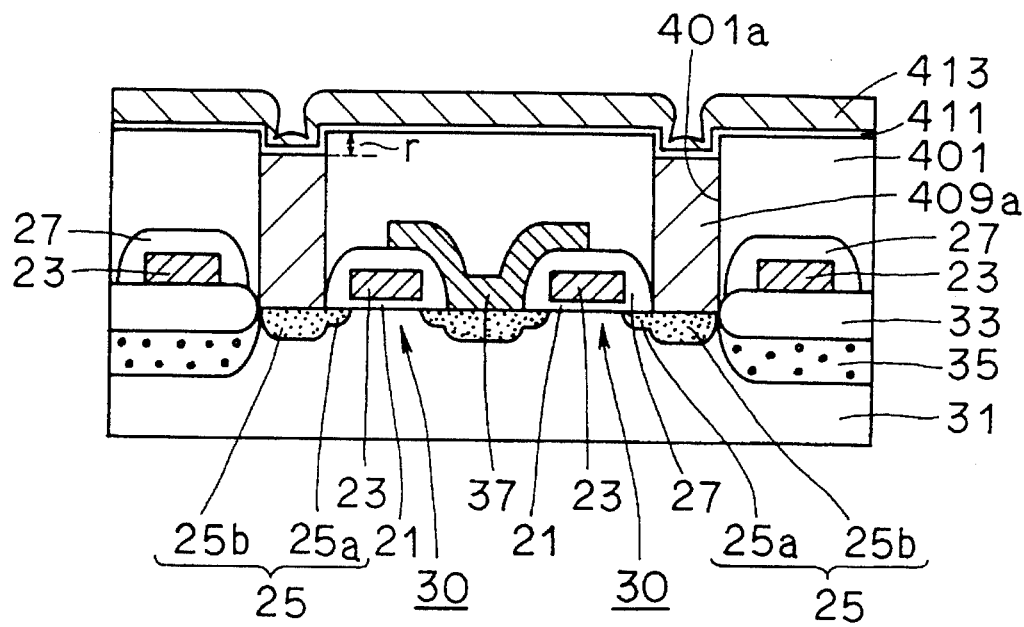
Figure 28:
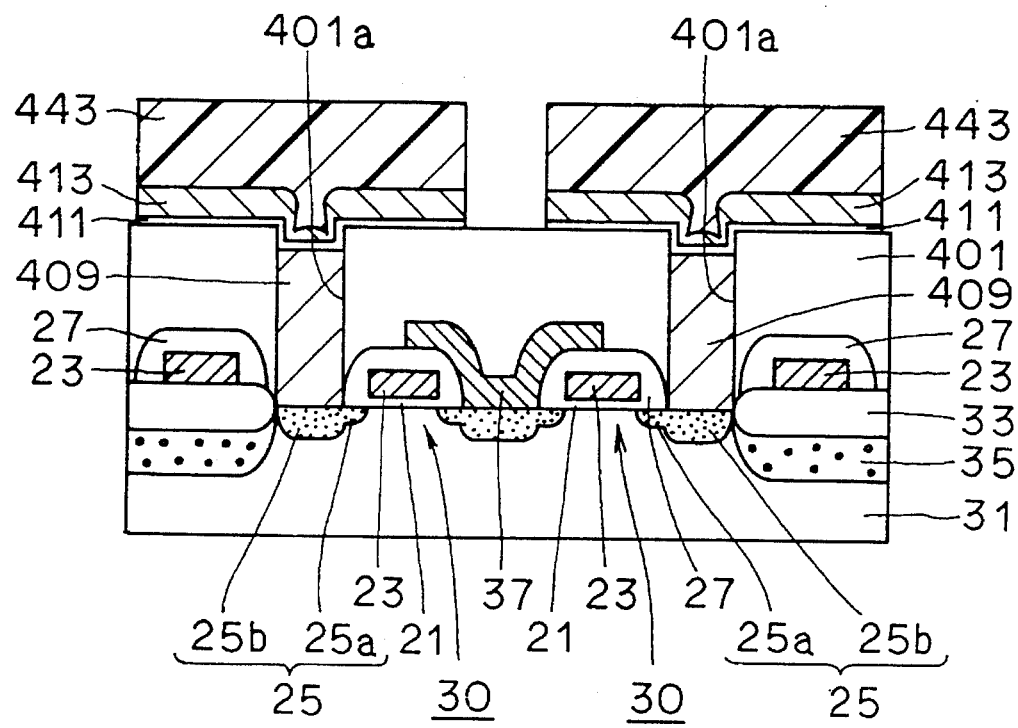
Figure 29:
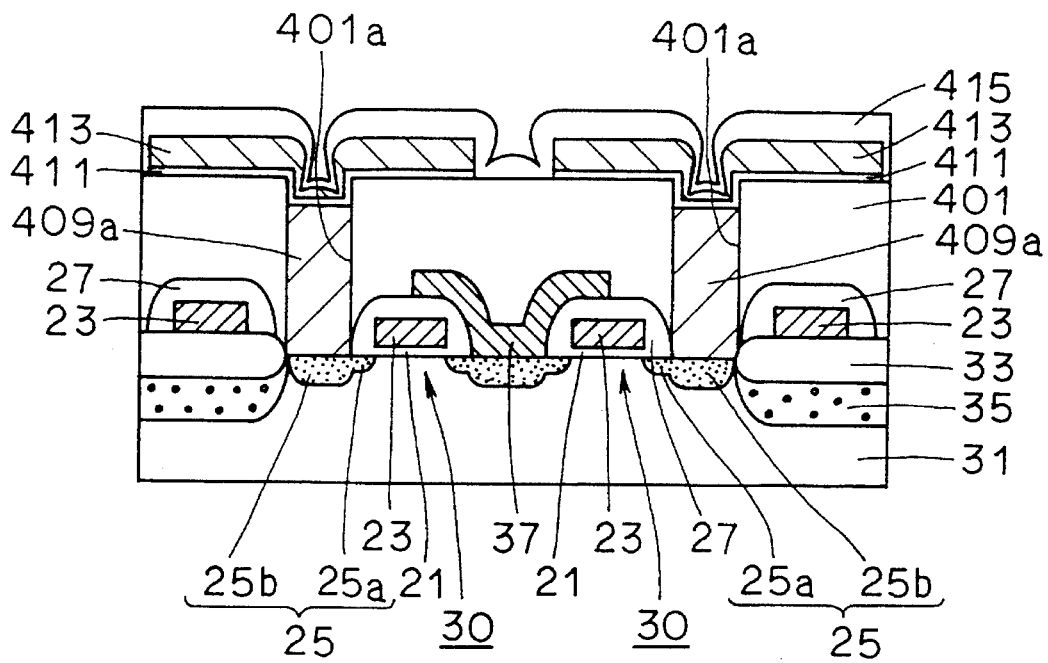
Figure 30:
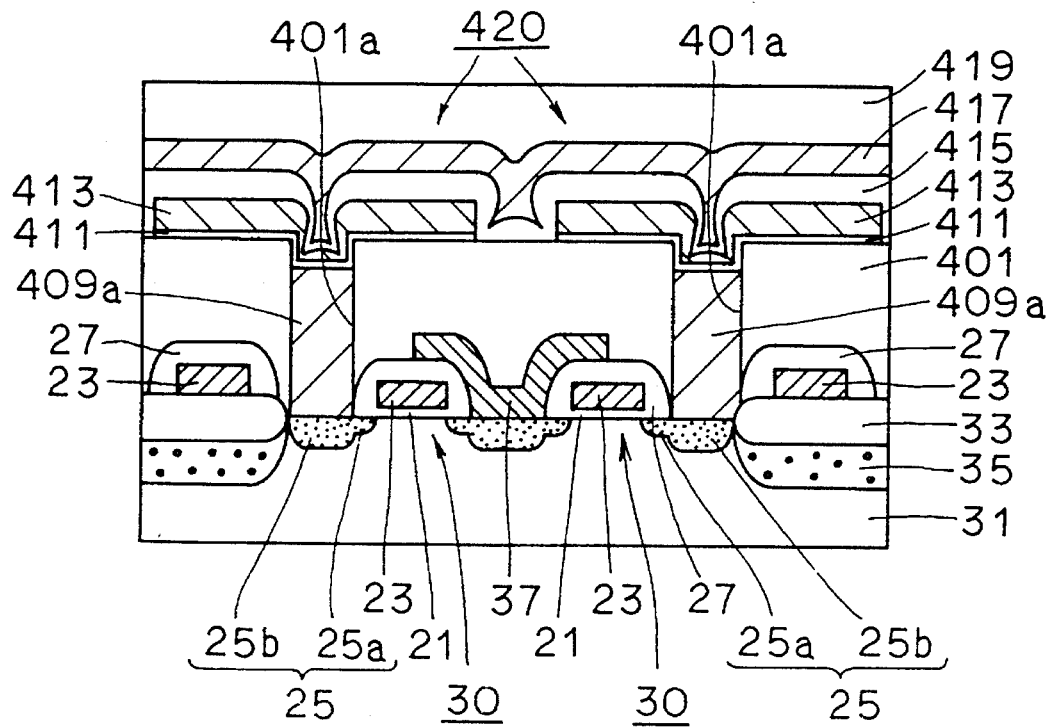
Figure 31:
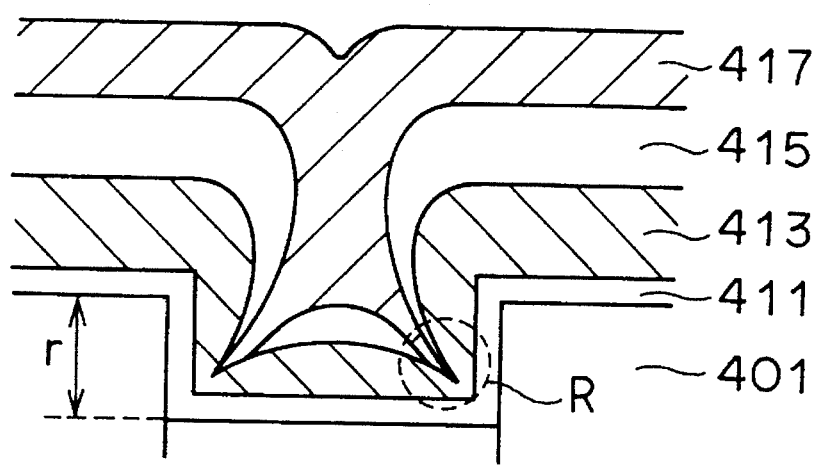
FIG. 31 is an enlarged cross section showing a first problem of the conventional semiconductor device, and particularly showing a portion P in FIG. 20.
Figure 32:
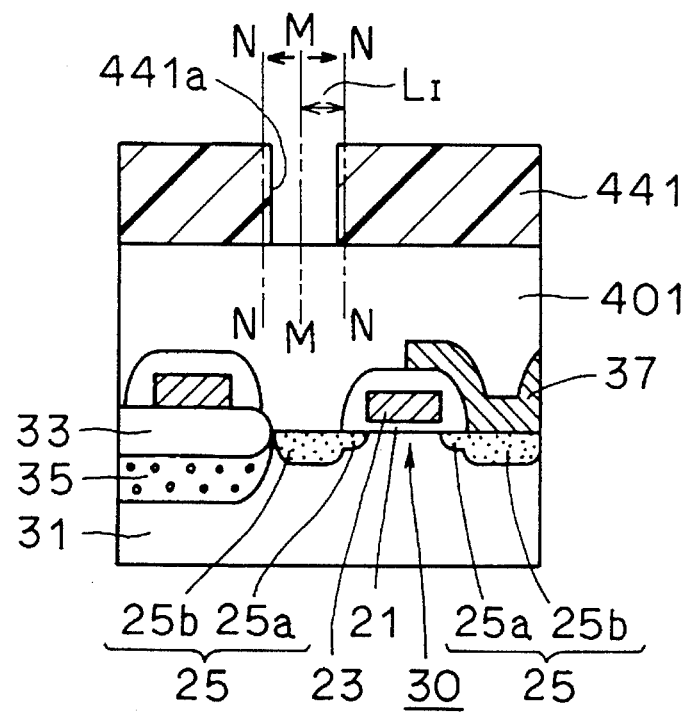
FIGS. 32 to 34 are schematic cross sections showing a state in which a plug layer and a gate electrode are connected together in the conventional semiconductor device in accordance with the order of the steps.
Figure 33:
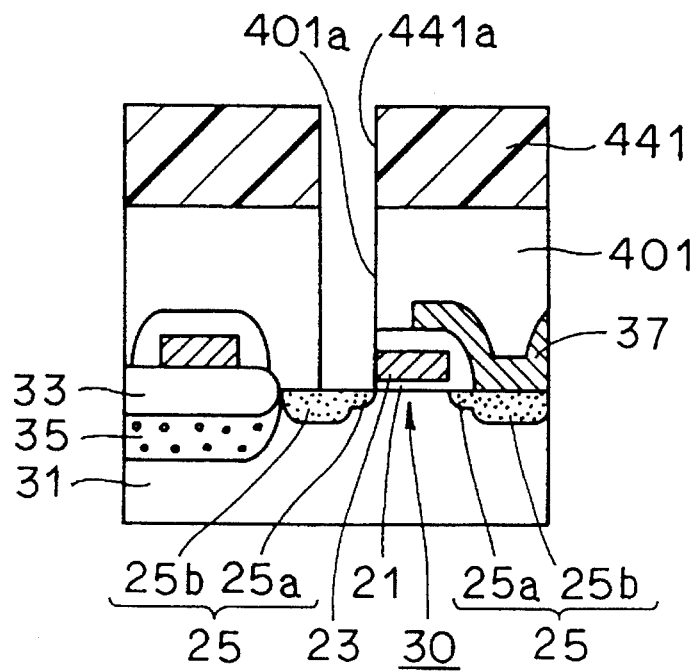
Figure 34:
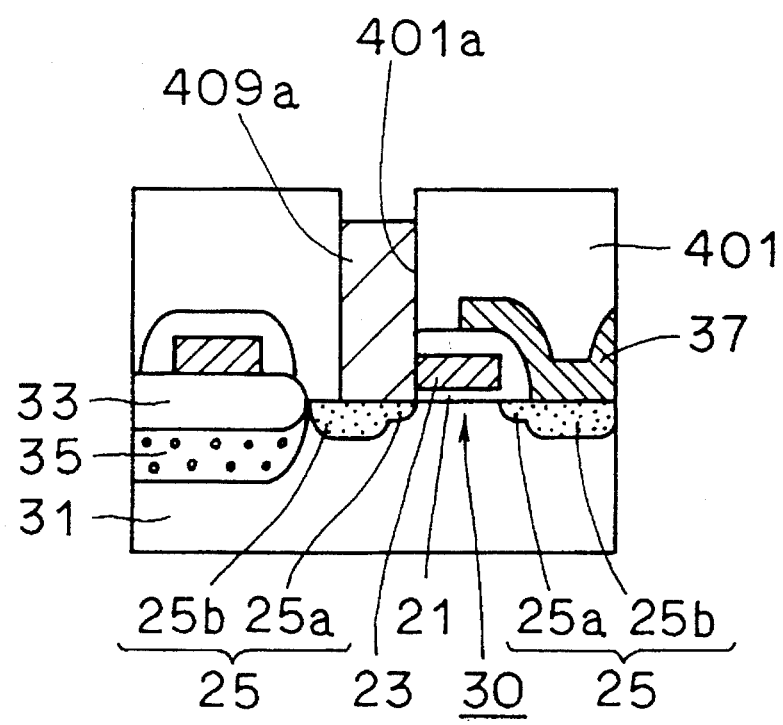
Figure 35:
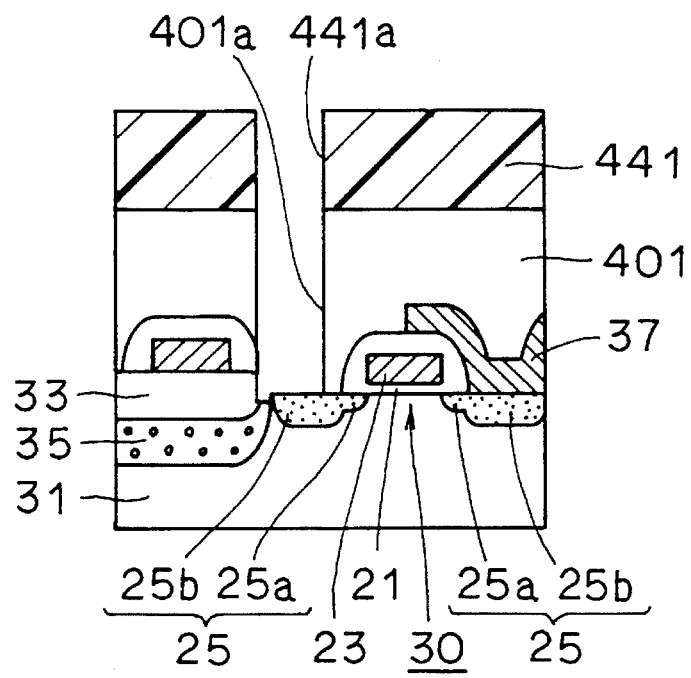
FIGS. 35 and 36 shows a state in which a plug layer and a channel stopper region are connected together in the conventional semiconductor device in accordance with the order of the steps.
Figure 36:
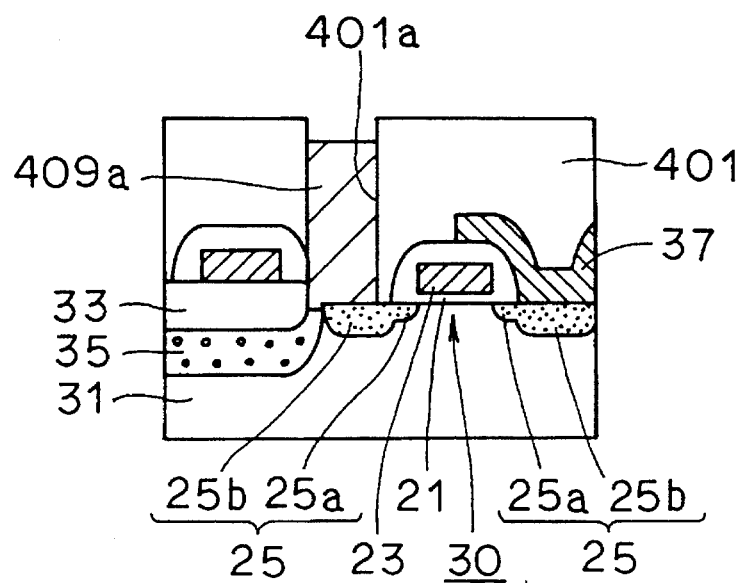
Figure 37A:
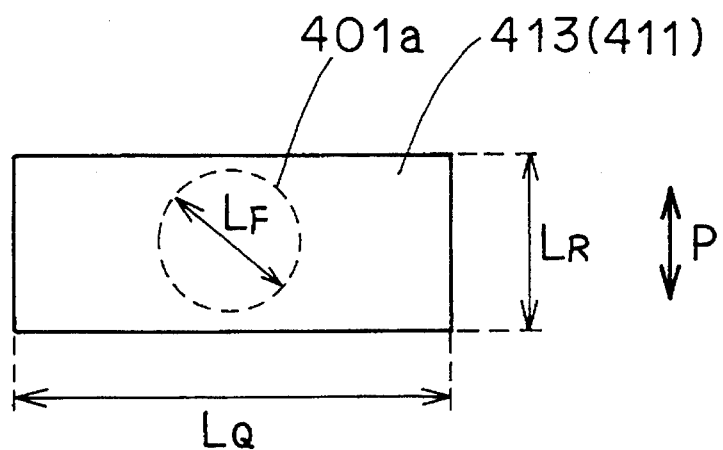
FIGS. 37A and 37B are schematic plans showing a state in which a contact hole is shifted from a region for forming a lower electrode layer in the conventional semiconductor device.
Figure 37B:
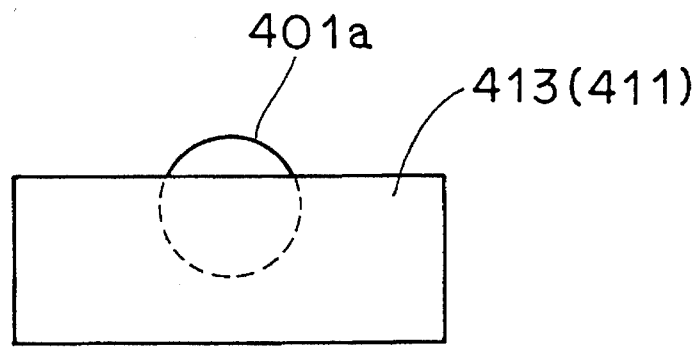
Figure 38:
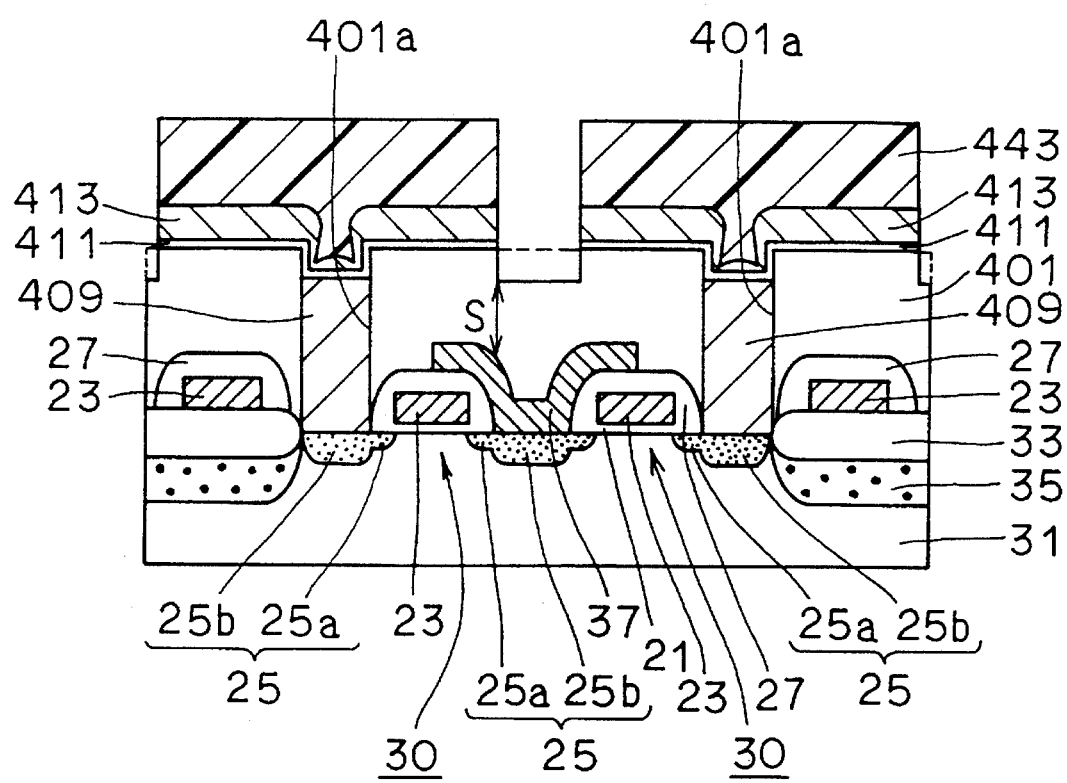
FIG. 38 is a schematic cross section showing a reduction of a film thickness of an interlayer insulating film during patterning of a lower electrode layer in the conventional semiconductor device.

More specifically, if it is assumed that the difference r in level at the step in the recess according to the prior art shown in FIG. 26 is 1000 Å, then the difference in level at the step in the recess of this embodiment would be 100 Å. Thus, even if the recess is formed, the difference in level at the recess is remarkably smaller than that in the prior art, so that it is possible to prevent reduction of the anti-leak characteristics and breakdown voltage characteristics due to step coverage of lower electrode layer 13 and capacitor insulating layer 15 at the recess.

In the process of forming contact hole 1a and 3a in the interlayer insulating films 1 and 3, first holes 5a are first formed in the first cover film 5 as shown in FIG. 4. These first holes 5a are formed by photolithography. Therefore, the open diameter $L_C$ of first hole 5a cannot be made smaller than the minimum processible diameter of 0.4 μm attained by the photolithography.

In the process shown in FIGS. 5 and 6, however, second cover film 7 is anisotropically etched to form frames 7a of the sidewall spacer configuration on the sidewalls of first holes 5a. Therefore, the open diameter $L_A$ of each frame 7a can be made smaller by the width $L_D$ of the frame than the minimum processible size $L_C$ attained by the photolithography. Thus, the open diameter $L_A$ of frame 7a is equal to $L_C - 2 \times L_D$.

Anisotropic etching is effected on silicon nitride film 3 and silicon oxide film 1 using first cover film 5 and frames 7a having such open diameter $L_A$, whereby contact holes 1a and 3a of the diameter substantially equal to the open diameter $L_A$ of the frame are formed as shown in FIG. 8. Thus, the open diameter $L_A$ of the contact holes can be made smaller than the minimum processible diameter of 0.4 μm attained by the photolithography.

Thereby, contact hole 1a and 3a can be formed at a narrower space in accordance with the same design rules, so that the overlap margin in the photolithographic patterning process can be enlarged.

More specifically, referring to FIG. 1, the open diameter $L_A$ of contact hole 1a and 3a formed in interlayer insulating films 1 and 3 is smaller than the minimum processible diameter attained by the photolithography. Therefore, even if contact hole 1a and 3a is formed, e.g., between word lines (gate electrodes) 23, the overlap margin between contact hole 1a and 3a and word lines 23 can be increased correspondingly to the allowable reduction of the open diameter $L_A$. Thereby, the overlap margin larger than the overlap margin of resist pattern 41 shown in FIG. 4 can be ensured. It is therefore possible to prevent the contact between plug layer 9a and word line 23 as well as the contact between plug layer 9a and channel stopper region 35, so that the pitch between word lines 23 can be reduced. Also, it is possible to prevent protrusion of contact hole 1a and 3a from the region at which the lower electrode layer is formed. Accordingly, the memory cells and others can be integrated to a higher extent.

Referring to FIG. 12, when lower electrode layer 13 and barrier layer 11 are patterned, silicon nitride film 3 exists under barrier layer 11. This silicon nitride film 3 has a large etching selectivity with respect to titanium or the like forming barrier layer 11. Therefore, in the process of patterning lower electrode layer 13, silicon nitride film 3 is hardly etched, although barrier layer 11 is etched. Accordingly, such a situation can be prevented that the insulating property and breakdown voltage characteristics of interlayer insulating films 1 and 3 degrade due to reduction of the thickness of silicon nitride film 3. Consequently, the semiconductor device can have the good insulating property and breakdown voltage characteristics.

In this embodiment, the first insulating film forming the interlayer insulating film is made of the silicon oxide film, and the second insulating film is made of the silicon nitride film. Also, plug layer 9a is made of doped polycrystalline silicon. In the invention, however, the first and second insulating films as well as the plug layer may be made of other kind of material, provided that the first and second etching insulating films have different etch characteristics, and that the second insulating film and plug layer have substantially the same etch characteristics.

In the embodiment described above, the interlayer insulating film has the two-layer structure. However, it may have a single layer structure, even in which case the top surface of the interlayer insulating film can be substantially flush with the top surface of the plug layer. Now, a semiconductor device including the interlayer insulating film formed of a single layer will be described below.

Figure 15:
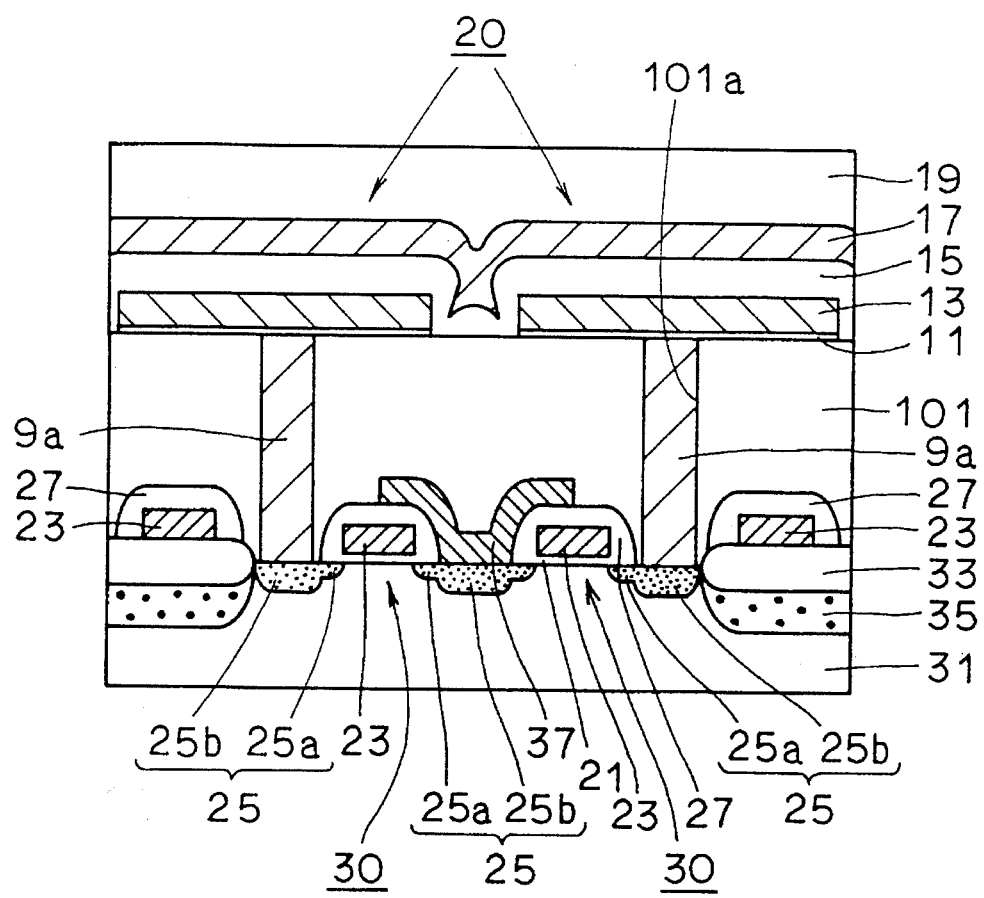
FIG. 15 is a cross section schematically showing a structure of a semiconductor device of a second embodiment of the invention.

Referring to FIG. 15, the structure of the semiconductor device of this embodiment is different in the structure of the interlayer insulating film from the first embodiment already described. In this embodiment, an interlayer insulating film 101 is formed of a single layer of an insulting film such as a silicon nitride film. The top surface of interlayer insulating film 101 formed of this silicon nitride film is substantially flush with the top surfaces of plug layers 9a.

Structures other than the above are substantially the same as those of the semiconductor device of the first embodiment of FIG. 1, and thus will not be described below.

Representative steps in the method of manufacturing the semiconductor device of the second embodiment will be described below.

Figure 16:
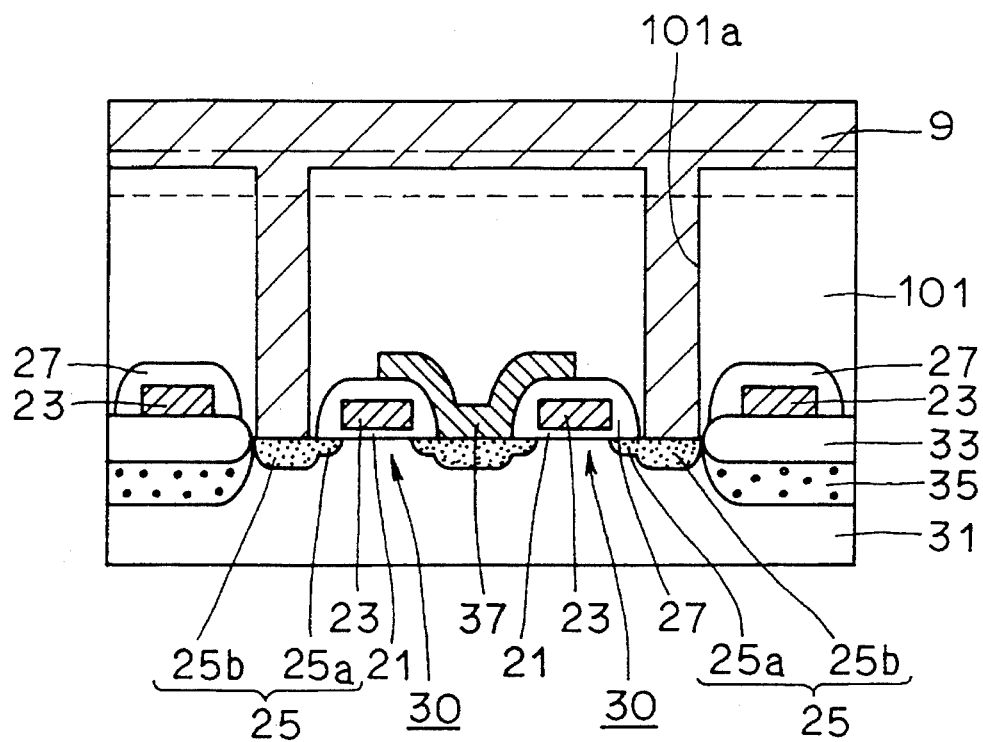
FIGS. 16 and 17 are schematic cross sections showing a representative process of manufacturing the semiconductor device of a second embodiment of the invention in accordance with the order of the steps.

Referring first to FIG. 16, contact hole 101a is formed at silicon nitride film 101 covering transfer gate transistors 30 and bit line 37. A part of the surface of only the other of source/drain regions 25 is exposed through contact hole 101a. Doped polycrystalline silicon film 9 is formed on the whole surface of silicon nitride film 101 so that it fills contact hole 101a and is in contact with source/drain regions 25.

In order to form the plug layer, etchback is effected on doped polycrystalline silicon film 9 up to a level indicated by dotted line. This etching is specifically performed by the RIE of the parallel plate type with gas system of $SF_6$, flow rate of $SF_6$ of 100 sccm, gas pressure of 500 mTorr, RF power of 200 W, for 1 to 2 minutes and input power of 0.25 W/cm$^2$. An etch rate of doped polycrystalline silicon film 9 is from 4000 to 6000 Å/min. Under these etching conditions, the etching selectivity of doped polycrystalline silicon film 9 with respect to silicon nitride film 101 is from 1 to 2. Therefore, when doped polycrystalline silicon film 9 is over-etched in the etchback process, silicon nitride film 101 and doped polycrystalline silicon film 9 are removed by substantially equal thickness from the original top surface level of silicon nitride film 101.

Figure 17:
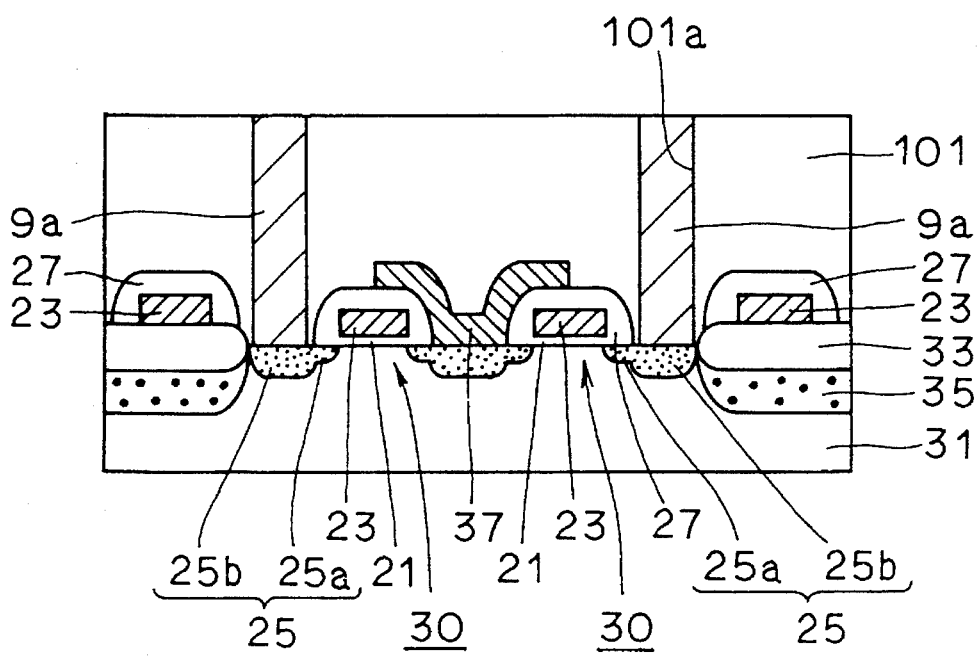
Figure 18:
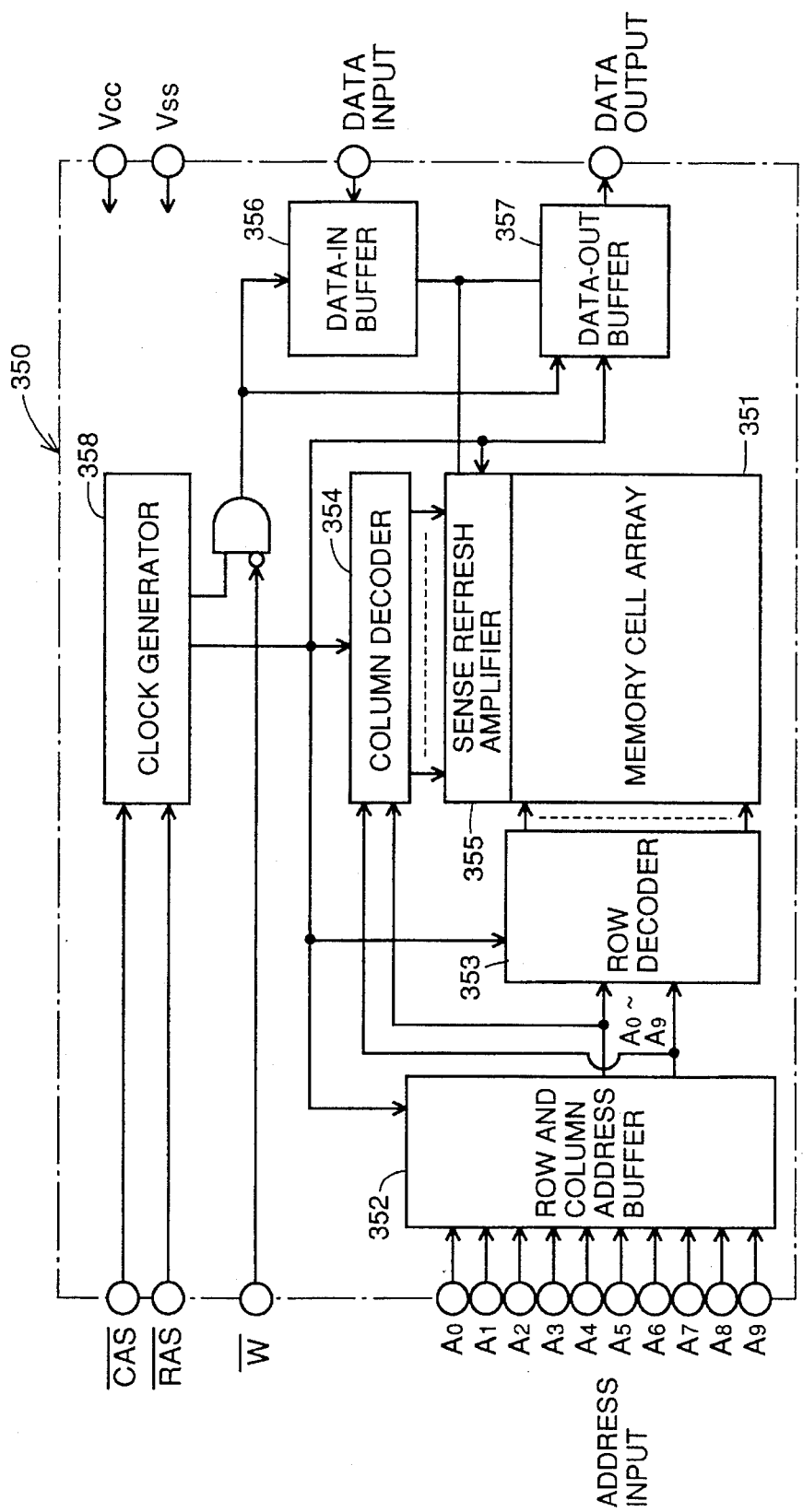
FIG. 18 is a block diagram of a conventional DRAM.
Figure 19:
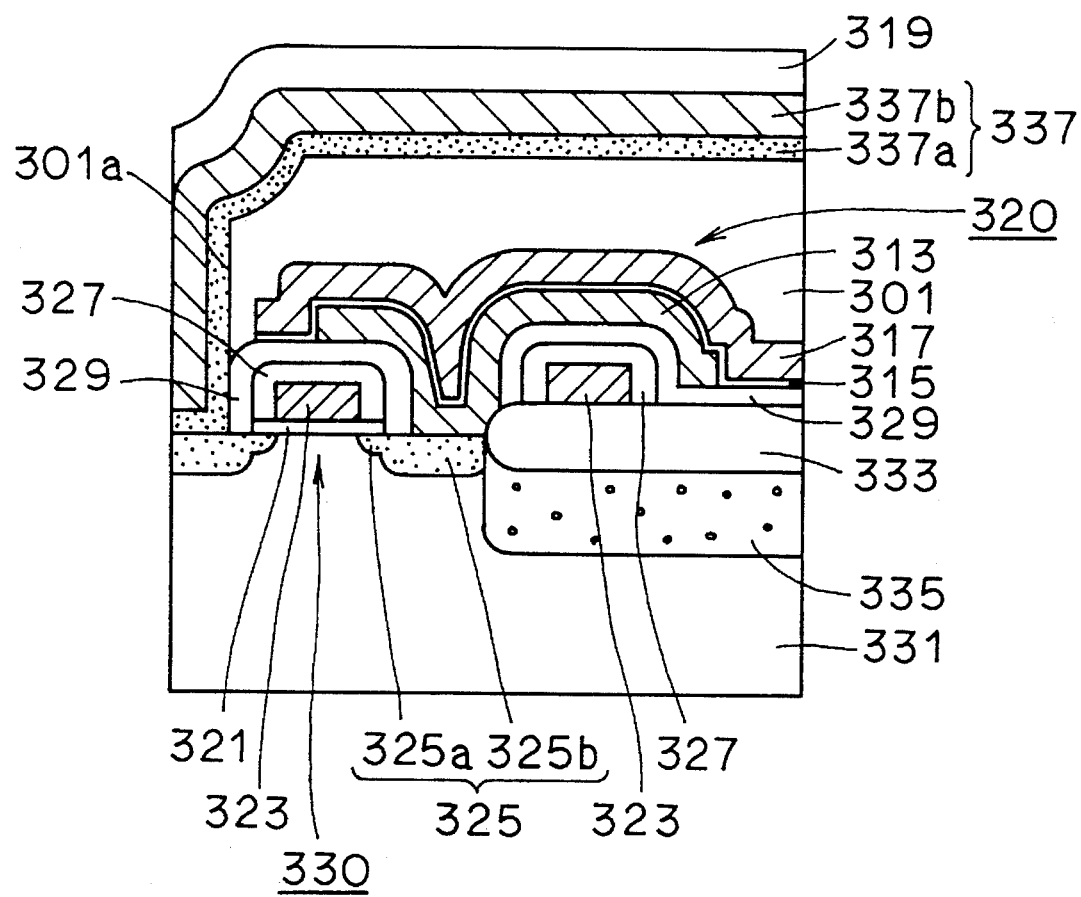
FIG. 19 is a schematic cross section showing a memory cell structure of a DRAM having a conventional stacked type capacitor.
Figure 20:
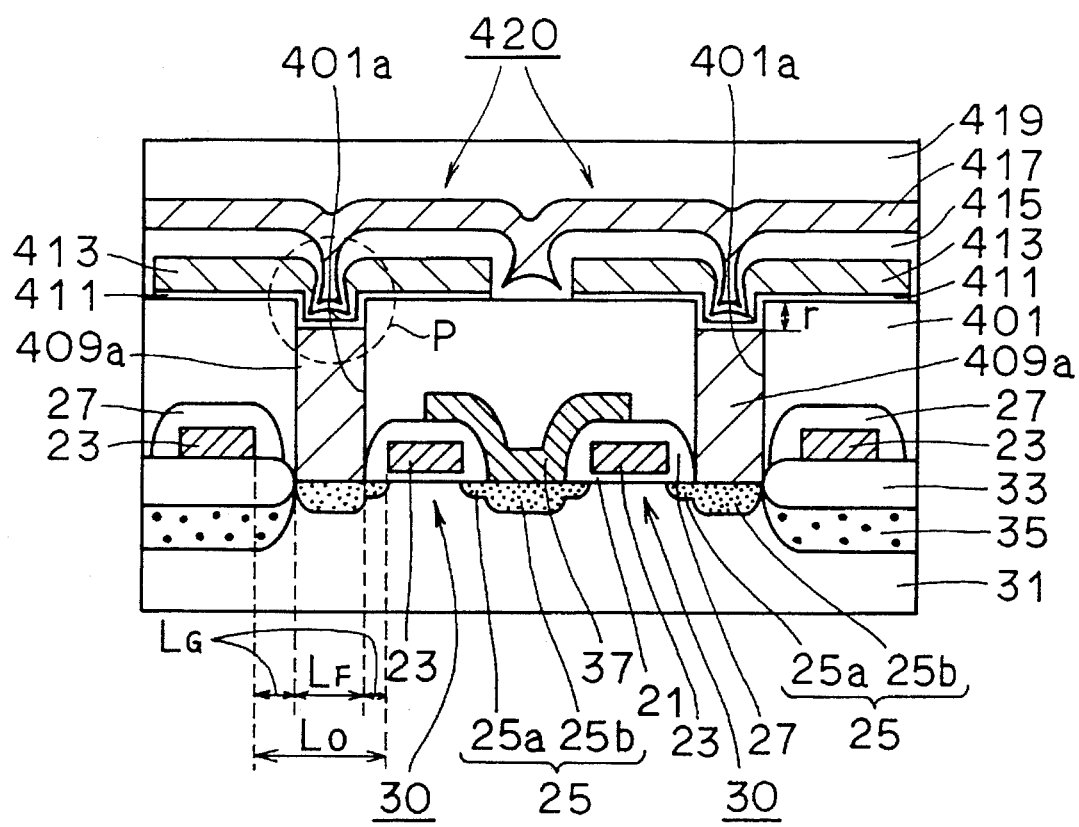
FIG. 20 is a schematic cross section showing a configuration of a conventional semiconductor device.
Figure 21:
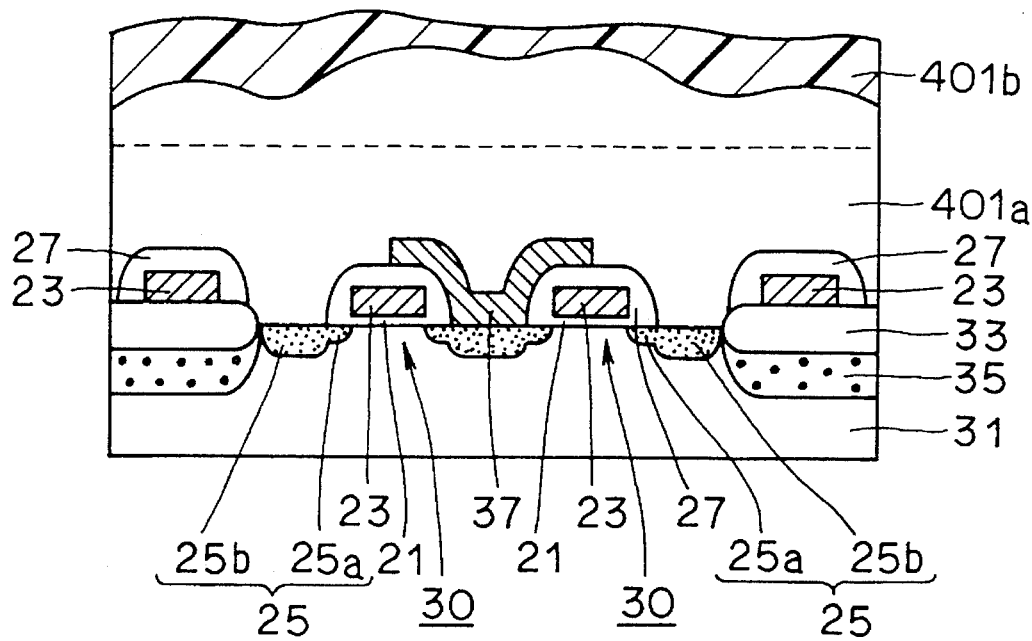
FIGS. 21 to 30 are schematic cross sections showing a process of manufacturing the conventional semiconductor device in accordance with the order of the steps.
Figure 22:
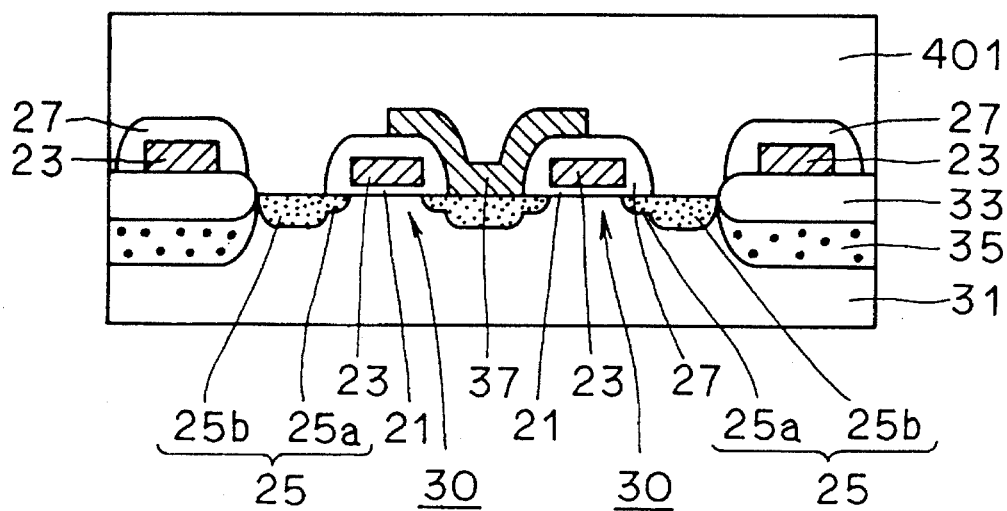
Figure 23:
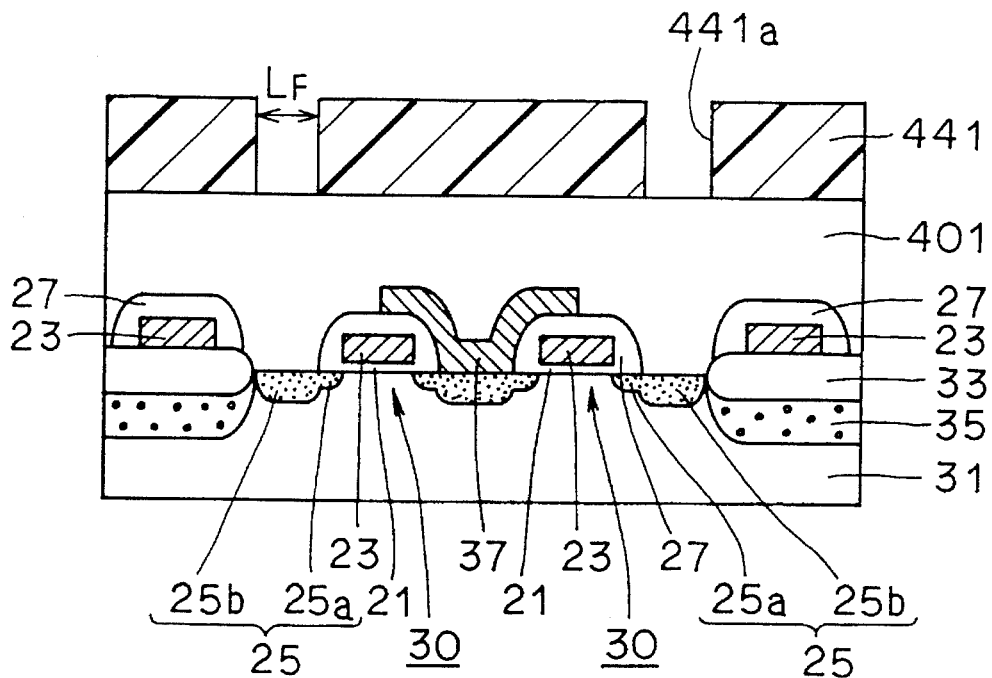
Figure 24:
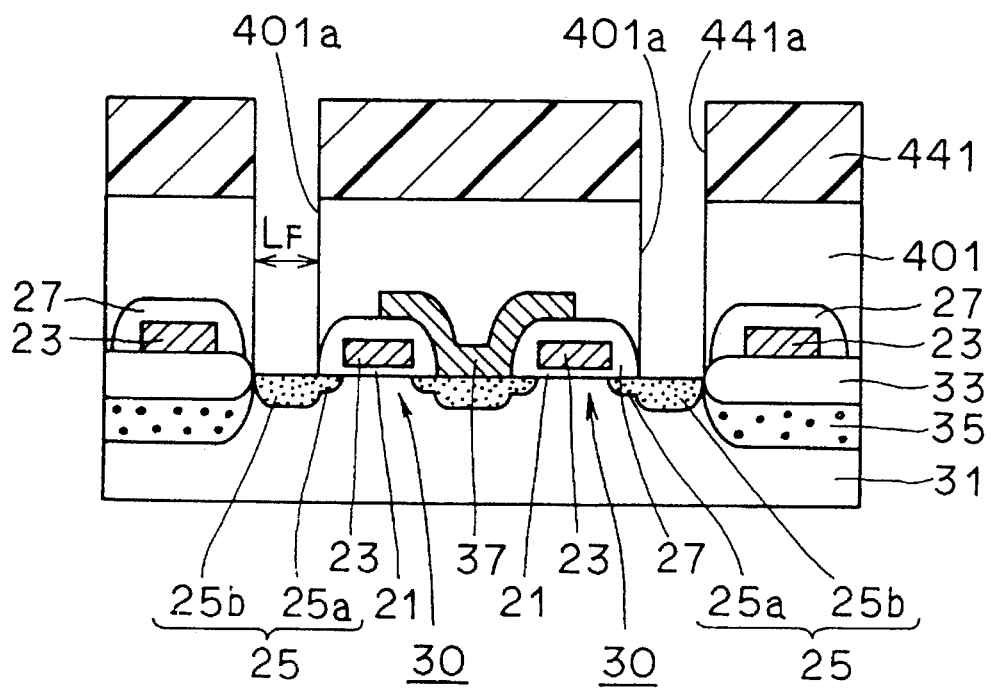
Figure 25:
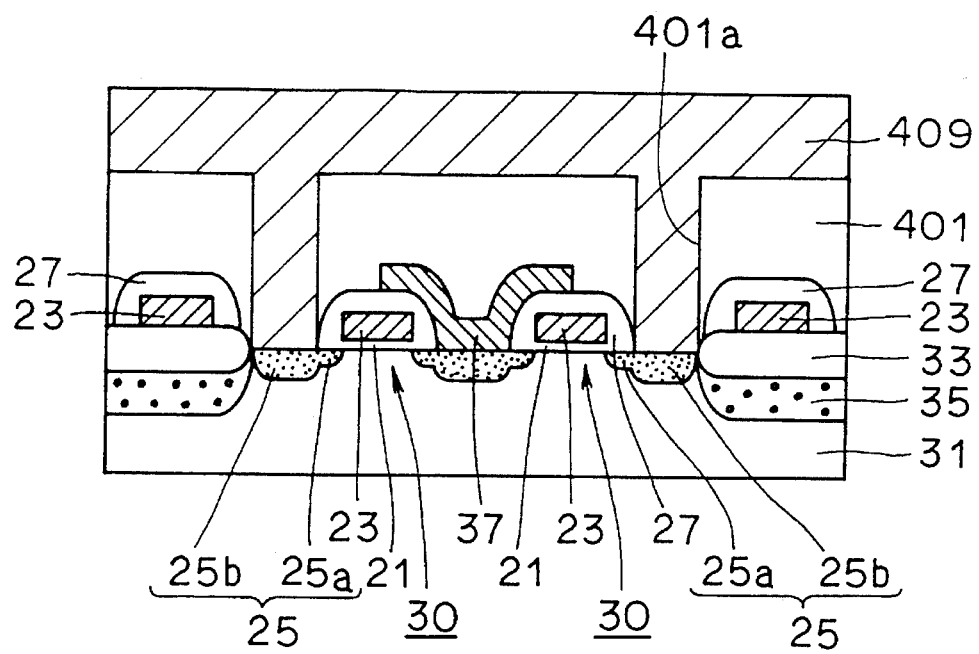

Referring to FIG. 17, by the aforementioned etchback plug layer 9a is formed for doped polycrystalline silicon film 9. The top surface of plug layer 9a is substantially flush with the top surface of silicon nitride film 101.

Thereafter, the lower electrode layer, capacitor insulating layer made of high permittivity dielectric material and upper electrode layer are formed on the above structure with the barrier layer therebetween, whereby the capacitor 20 is completed as shown in FIG. 15.

Even in the above case where the interlayer insulating film is formed of silicon nitride film 101, i.e., the single layer, the top surface of plug layer 9a can be substantially flush with the top surface of silicon nitride film 101. Therefore, similar to the first embodiment, it is possible to prevent degradation of the anti-leak characteristics and breakdown voltage characteristics, which may be caused by the coverage of the lower electrode layer 13 and capacitor insulating layer 15 at the recess.

Also in this embodiment, interlayer insulating film 101 is made of the single layer, and is specifically formed of the silicon nitride film. However, interlayer insulating film 101 may be formed of a film or layer other than the silicon nitride film. Also, plug layer 9a may be formed from a film or layer other than the doped polycrystalline silicon film. Thus, interlayer insulating film 101 and plug layer 9a have only to be made of material having substantially the same etch characteristics.

Sputter etching with argon (Ar) may be used, in which case the plug layer can be formed to have the top surface substantially flush with the top surface of the interlayer insulating film. This will be briefly described below.

Argon sputter etching is disclosed, for example, in M. SATO et al., "1985 DRY PROCESS SYMPOSIUM", pp. 102–107. According to this argon sputter etching, any kind of film can be etched at substantially equal etch rate regardless of the quality of the film to be etched.

Referring to FIG. 16, conductive film 9 is formed on the whole surface of interlayer insulating film 101 to fill contact hole 101a. RIE is effected on conductive film 9 to remove a portion, for example, above the level indicated by alternate long and short dash line, i.e., at a depth from 500 to 1000 Å from the original top surface of interlayer insulating film 101. Thereafter, the argon sputter etching described above is performed.

As described above, any kind of film can be etched at substantially equal etch rate regardless of the film quality. Therefore, in the case where interlayer insulating film 101 and doped polycrystalline silicon film 9 are etched by the argon sputter etching, for example, up to the level indicated by the dotted line, such etching can be performed very easily that the top surfaces of both films 101 and 9 are flush with each other. Therefore, as shown in FIG. 17, the top surface of plug layer 9a can be substantially flush with the top surface of interlayer insulating film 101. Similar to the first and second embodiments already described, it is therefore possible to prevent degradation of the anti-leak characteristics and breakdown voltage characteristics, which may occur due to coverage of the lower electrode layer and capacitor insulating film at the recess.

If the argon sputter etching is used, the interlayer insulating film and plug layer may be formed of various kinds of material.

In the first and second embodiments, barrier layer 11 is formed of the three-layer structure including titanium, titanium nitride and titanium layers. However, barrier layer 11 is not restricted to this, and may be made of any kind of material provided that it can ensure the function as the barrier. More specifically, the barrier layer 11 may include a titanium layer, a titanium nitride layer and a titanium oxide layer, such as a three-layer structure of titanium/titanium oxide/titanium nitride. The order of stucking layers constituting the barrier layer 11 may be arbitrarily set.

The high permittivity dielectric material is not limited to PZT and PLZT mentioned above, and any material having high permittivity such as barium strontium titanate (BST) may be used.

According to the method of manufacturing the semiconductor device of the invention, the insulating film covering the impurity region is formed of the first and second insulating films. The second insulating film between them has the etch characteristics substantially equal to those of the conductive film formed on the second insulating film. Therefore, the top surface of the second insulating film can be made substantially flush with the top surface of the plug layer formed of the conductive film. Thus, the top surface of the plug layer at the second and third holes is not recessed from the top surface of the second insulating film. Accordingly, the semiconductor device can have the good anti-leak characteristics and good breakdown voltage characteristics.

According to the method of manufacturing the semiconductor device of the invention, the first cover film having the first hole is formed on the second insulating film. The first hole is formed, for example, by photolithography. Therefore, the open diameter of the first hole cannot be smaller than the minimum processible size attained by the photolithography. However, owing to the formation of the sidewall film on the sidewall of the first hole, the second hole having the open diameter smaller than the minimum processible diameter attained by the photolithography can be formed in the first and second insulating films by the anisotropic etching which is sequentially effected on the second and first insulating films using the first cover film and the sidewall film. Thereby, the second and third holes can be formed in a narrower space in accordance with the same design rules, and the overlap margin in the photolithographic patterning process can be increased. Therefore, the semiconductor device which can comply with the high integration can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate having a main surface;

an impurity region formed at said main surface of said semiconductor substrate;

a first insulating film formed on said main surface of said semiconductor substrate to cover said impurity region and having a first hole reaching a portion of a surface of said impurity region;

a second insulating film formed on said first insulating film, and having a second hole communicating with said first hole, said first and second holes having an open diameter extending from the top surface of said second insulating film to said impurity region;

a buried conductive layer in contact with a portion of a surface of said impurity region, filling said first and second holes and having a surface substantially flush with the top surface of said second insulating film, said buried conductive layer having etch characteristics substantially equal to those of said second insulating film;

a lower electrode layer in contact with said buried conductive layer and formed on the top surface of said second insulating film;

a capacitor insulating layer covering said lower electrode layer and containing high permittivity dielectric material; and an upper electrode layer covering said lower electrode layer with said capacitor insulating layer therebetween.

2. The semiconductor device according to claim 1, wherein said second insulating film is made of a material containing silicon nitride.

3. The semiconductor device according to claim 1, further comprising
   a barrier layer located between said lower electrode layer and said buried conductive layer and between said lower electrode layer and said second insulating film.

4. The semiconductor device according to claim 3, wherein
   said barrier layer has a multi-layer structure including a titanium layer, a titanium nitride layer and a titanium oxide layer.

5. The semiconductor device according to claim 1, wherein
   said capacitor insulating layer is made of at least a material selected from the group consisting of tantalum oxide ($Ta_2O_5$), lead titanate zirconate (PZT), lanthan-lead titanate zirconate (PLZT), strontium titanate (STO), barium titanate (BTO) and barium strontium titanate (BST).

6. The semiconductor device according to claim 1, wherein
   said impurity region has a source/drain region of an MOS transistor.

7. The semiconductor device according to claim 1, wherein the diameter of the first and second holes is smaller than the minimum diameter which can be attained by conventional photolithographic techniques.

* * * * *